US012422387B2

(12) United States Patent
Wieland et al.

(10) Patent No.: US 12,422,387 B2
(45) Date of Patent: Sep. 23, 2025

(54) CHARGED PARTICLE OPTICAL DEVICE, OBJECTIVE LENS ASSEMBLY, DETECTOR, DETECTOR ARRAY, AND METHODS

(71) Applicant: ASML Netherlands B.V., Veldhoven (NL)

(72) Inventors: Marco Jan-Jaco Wieland, Delft (NL); Albertus Victor Gerardus Mangnus, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 18/487,946

(22) Filed: Oct. 16, 2023

(65) Prior Publication Data

US 2024/0044824 A1 Feb. 8, 2024

Related U.S. Application Data

(63) Continuation of application No. 17/559,950, filed on Dec. 22, 2021, now Pat. No. 11,821,859.

(30) Foreign Application Priority Data

| Dec. 23, 2020 | (EP) | 20216927 |
| May 18, 2021 | (EP) | 21174518 |
| Aug. 17, 2021 | (EP) | 21191729 |

(51) Int. Cl.
*G01N 23/2251* (2018.01)
*G01N 23/203* (2006.01)
(Continued)

(52) U.S. Cl.
CPC ....... *G01N 23/2251* (2013.01); *G01N 23/203* (2013.01); *H01J 37/10* (2013.01); *H01J 37/244* (2013.01)

(58) Field of Classification Search
CPC ... G01N 23/2251; G01N 23/203; H01J 37/10; H01J 37/244; H01J 2237/04735;
(Continued)

(56) References Cited

U.S. PATENT DOCUMENTS 6,399,945 B1 * 6/2002 Hirayanagi ......... H01J 37/244
250/397
7,045,794 B1 5/2006 Spallas et al.
(Continued)

FOREIGN PATENT DOCUMENTS

| WO | WO 2019/158573 A1 | 8/2019 |
| WO | WO 2020/135963 A1 | 7/2020 |

(Continued)

OTHER PUBLICATIONS

Chen Sheng-Yung et al: "beam drift detection using a two-dimensional electron-beam position monitoring system for multiple-electron-beam-direct-write lithography", Journal of Vacuum Science and Technology: Part B (2 pgs.).

*Primary Examiner* — David A Vanore
(74) *Attorney, Agent, or Firm* — Finnegan, Henderson, Farabow, Garrett & Dunner, LLP

(57) ABSTRACT

The embodiments of the present disclosure provide various techniques for detecting backscatter charged particles, including accelerating charged particle sub-beams along sub-beam paths to a sample, repelling secondary charged particles from detector arrays, and providing devices and detectors which can switch between modes for primarily detecting charged particles and modes for primarily detecting secondary particles.

20 Claims, 9 Drawing Sheets

(51) Int. Cl.
*H01J 37/10* (2006.01)
*H01J 37/244* (2006.01)

(58) Field of Classification Search
CPC ......... H01J 2237/057; H01J 2237/1205; H01J 2237/24475; H01J 37/28; H01J 37/12
See application file for complete search history.

(56) References Cited

U.S. PATENT DOCUMENTS

| | | | |
|---|---|---|---|
| 7,335,895 B1 | 2/2008 | Spallas et al. | |
| 8,198,602 B2 | 6/2012 | Steenbrink et al. | |
| 9,673,024 B2 | 6/2017 | Knippelmeyer | |
| 9,922,796 B1 | 3/2018 | Frosien | |
| 10,176,965 B1 | 1/2019 | Breuer | |
| 10,453,645 B2 | 10/2019 | Frosien | |
| 10,504,687 B2 | 12/2019 | Kruit | |
| 11,054,753 B1 | 7/2021 | Kaplan et al. | |
| 11,495,433 B1 | 11/2022 | Cook | |
| 11,821,859 B2 * | 11/2023 | Wieland | G01N 23/2251 |
| 12,068,128 B2 * | 8/2024 | Nakamura | H01J 37/28 |
| 2003/0189180 A1 | 10/2003 | Hamaguchi et al. | |
| 2004/0046120 A1 * | 3/2004 | Moses | H01J 37/20 |
| | | | 250/311 |
| 2004/0217297 A1 * | 11/2004 | Moses | H01J 37/28 |
| | | | 250/441.11 |
| 2006/0033038 A1 * | 2/2006 | Moses | H01J 37/28 |
| | | | 250/440.11 |
| 2007/0194231 A1 | 8/2007 | Nakahira | |
| 2008/0067376 A1 | 3/2008 | Tanimoto | |
| 2009/0261267 A1 | 10/2009 | Wieland et al. | |
| 2010/0127168 A1 | 5/2010 | Khursheed | |
| 2010/0320382 A1 | 12/2010 | Almogy et al. | |
| 2011/0215241 A1 * | 9/2011 | Wang | G01N 23/00 |
| | | | 250/311 |
| 2011/0216299 A1 | 9/2011 | Steenbrink et al. | |
| 2012/0019648 A1 * | 1/2012 | Hoshino | H01J 37/26 |
| | | | 250/311 |
| 2013/0032729 A1 | 2/2013 | Knippelmeyer | |
| 2014/0361168 A1 | 12/2014 | Ogawa et al. | |
| 2016/0349228 A1 | 12/2016 | Kester | |
| 2016/0372304 A1 * | 12/2016 | Masnaghetti | G01N 23/203 |
| 2017/0002467 A1 * | 1/2017 | Straw | H01J 37/08 |
| 2017/0025243 A1 | 1/2017 | Ren | |
| 2017/0213688 A1 | 7/2017 | Ren | |
| 2018/0158642 A1 | 6/2018 | Frosien | |
| 2019/0066972 A1 | 2/2019 | Frosien | |
| 2019/0172677 A1 * | 6/2019 | Ren | H01J 37/141 |
| 2019/0259564 A1 | 8/2019 | Kruit et al. | |
| 2019/0355545 A1 | 11/2019 | Zeidler | |
| 2019/0378682 A1 | 12/2019 | Wang | |
| 2020/0321191 A1 * | 10/2020 | Ren | H01J 37/244 |
| 2021/0116398 A1 * | 4/2021 | Ren | H01J 37/244 |
| 2021/0210309 A1 | 7/2021 | Wieland | |
| 2022/0196581 A1 * | 6/2022 | Wieland | G01N 23/2251 |
| 2022/0230836 A1 | 7/2022 | Cook | |
| 2022/0246388 A1 | 8/2022 | Rauwolf | |
| 2023/0005706 A1 * | 1/2023 | Mangnus | H01J 37/145 |
| 2023/0207255 A1 * | 6/2023 | Beugin | H01J 37/1472 |
| | | | 250/307 |
| 2024/0038485 A1 * | 2/2024 | Steenbrink | H01J 37/241 |
| 2024/0044824 A1 * | 2/2024 | Wieland | H01J 37/28 |
| 2024/0079205 A1 * | 3/2024 | Wieland | H01J 37/12 |
| 2024/0087844 A1 * | 3/2024 | Mangnus | H01J 37/12 |
| 2024/0128043 A1 * | 4/2024 | Van Soest | H01J 37/12 |
| 2024/0272312 A1 * | 8/2024 | Mangnus | G01T 1/20182 |

FOREIGN PATENT DOCUMENTS

| | | |
|---|---|---|
| WO | WO 2021/165136 A1 | 8/2021 |
| WO | WO 2022/058252 A1 | 3/2022 |
| WO | WO 2022/058253 A2 | 3/2022 |

* cited by examiner

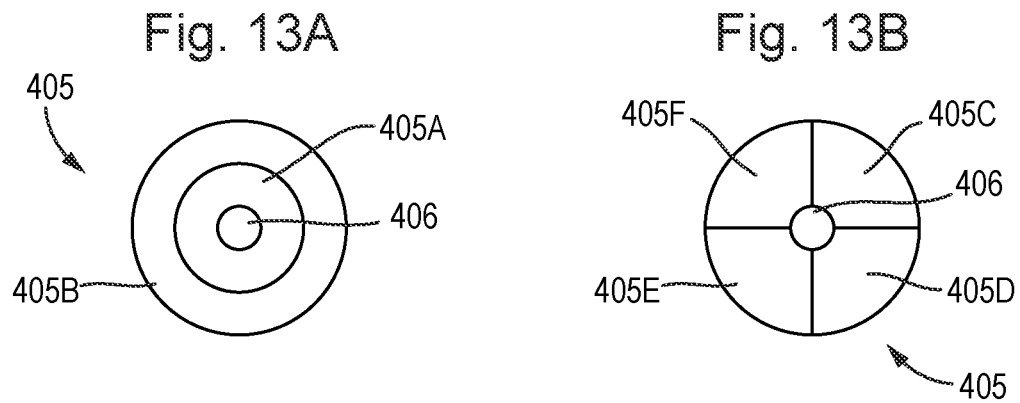
Fig. 13A
Fig. 13B
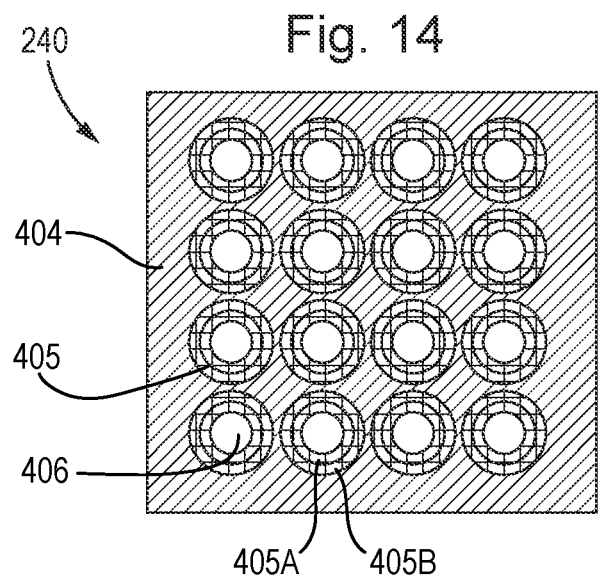
Fig. 14
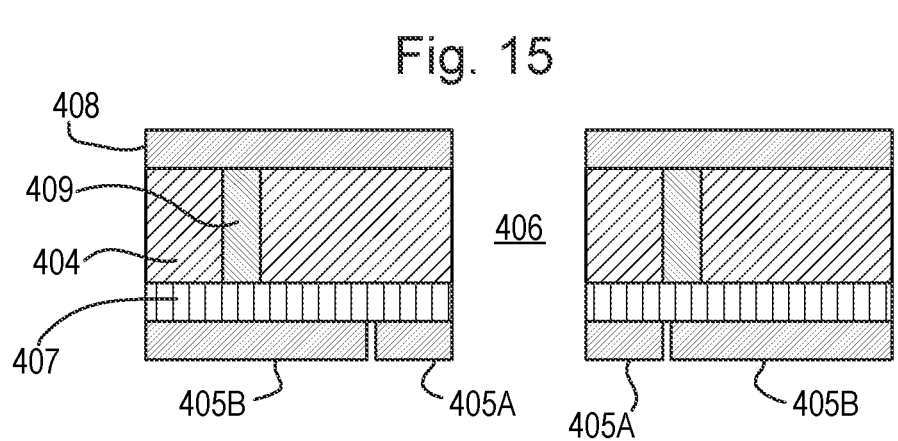
Fig. 15

CHARGED PARTICLE OPTICAL DEVICE, OBJECTIVE LENS ASSEMBLY, DETECTOR, DETECTOR ARRAY, AND METHODS

CROSS-REFERENCE TO RELATED APPLICATIONS

This application is a continuation application of U.S. application Ser. No. 17/559,950, filed Dec. 22, 2021, which claims priority of EP Application Serial No. 20216927.2, which was filed on Dec. 23, 2020, of EP Application Serial No. 21174518.7, which was filed on May 18, 2021, and of EP Application Serial No. 21191729.9, which was filed on Aug. 17, 2021, all of which are incorporated herein by reference in their entireties.

FIELD

The embodiments provided herein generally relate to objective lens assemblies, charged-particle-optical devices, detectors, detector arrays and methods, and particularly to objective lens assemblies, charged-particle-optical devices, a detector, a detector array and methods that use multiple beams (e.g. sub-beams) of charged particles.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain data which may be referred to as an image and which may be rendered into an image. The image represents characteristics of the material structure of the surface of the sample.

Although the images obtained in this way can be useful, there are limitations in the information obtained about the sample from such known electron microscopy techniques. In general, there is a need to obtain additional or alternative information, for example, relating to structures below the surface of the sample and relating to overlay targets.

SUMMARY

It is an object of the present disclosure to provide embodiments that support obtaining information from a sample using charged particles, for example, using backscattered charged particles.

According to some embodiments, there is provided a charged particle-optical device for a charged particle assessment tool, the device being configured to project a multi-beam of charged particles along sub-beam paths towards a sample, the multi-beam comprising sub-beams, the device comprising: an objective lens array configured to project an array of charged particle sub-beams onto the sample; wherein the objective lens array comprises at least two electrodes in which are defined aperture arrays, corresponding apertures of the aperture arrays in the at least two electrodes are aligned with and arranged along a sub-beam path of the array of charged particle sub-beams; and a detector array configured to be proximate the sample and configured to capture charged particles emitted from the sample, wherein the charged particle-optical device is configured to repel secondary charged particles emitted from the sample away from the detector.

According to a some embodiments, there is provided a charged particle-optical device for a charged particle assessment tool, the device being configured to project a multi-beam of charged particles along sub-beam paths towards a sample, the multi-beam comprising sub-beams, the device comprising: an objective lens array configured to project an array of charged particle sub-beams onto the sample, wherein the objective lens array comprises at least two electrodes in which are defined aperture arrays, corresponding apertures of the aperture arrays in the at least two electrodes are each aligned with, and arranged along, a sub-beam path of the array of charged particle sub-beams; and a detector array configured to be proximate a sample and configured to capture charged particles emitted from the sample, wherein the objective lenses are configured to accelerate the charged particle sub-beams along the sub-beam paths.

According to some embodiments, there is provided an objective lens assembly for projecting a multi-beam of charged particles towards a sample surface, the objective lens assembly comprising: an objective lens array comprising at least two electrodes arranged along the path of the multi-beam and in which are defined a plurality of apertures, corresponding apertures of the plurality of apertures in each of the at least two electrodes are aligned with and arranged along a sub-beam path of the path of the multi-beam, and a detector array configured to detect charged particles emanating from the sample in response to the multi-beam, wherein the detector array is configured to be positionable proximate to the sample and is configured to repel secondary electrons emanating from the sample away from the detector.

BRIEF DESCRIPTION OF FIGURES

The above and other aspects of the present disclosure will become more apparent from the description of exemplary embodiments, taken in conjunction with the accompanying drawings.

FIG. 13A and FIG. 13B are bottom views of different modified detectors, according to some embodiments of the present disclosure.

FIG. 14 is bottom view of the objective lens of FIG. 5 or FIG. 6 using a modified detector of FIG. 13, according to some embodiments of the present disclosure.

FIG. 15 is an enlarged schematic cross-sectional view of a detector incorporated in the objective lens of FIG. 5 or FIG. 6 using the modified detector of FIG. 13, according to some embodiments of the present disclosure.

Figure 1:
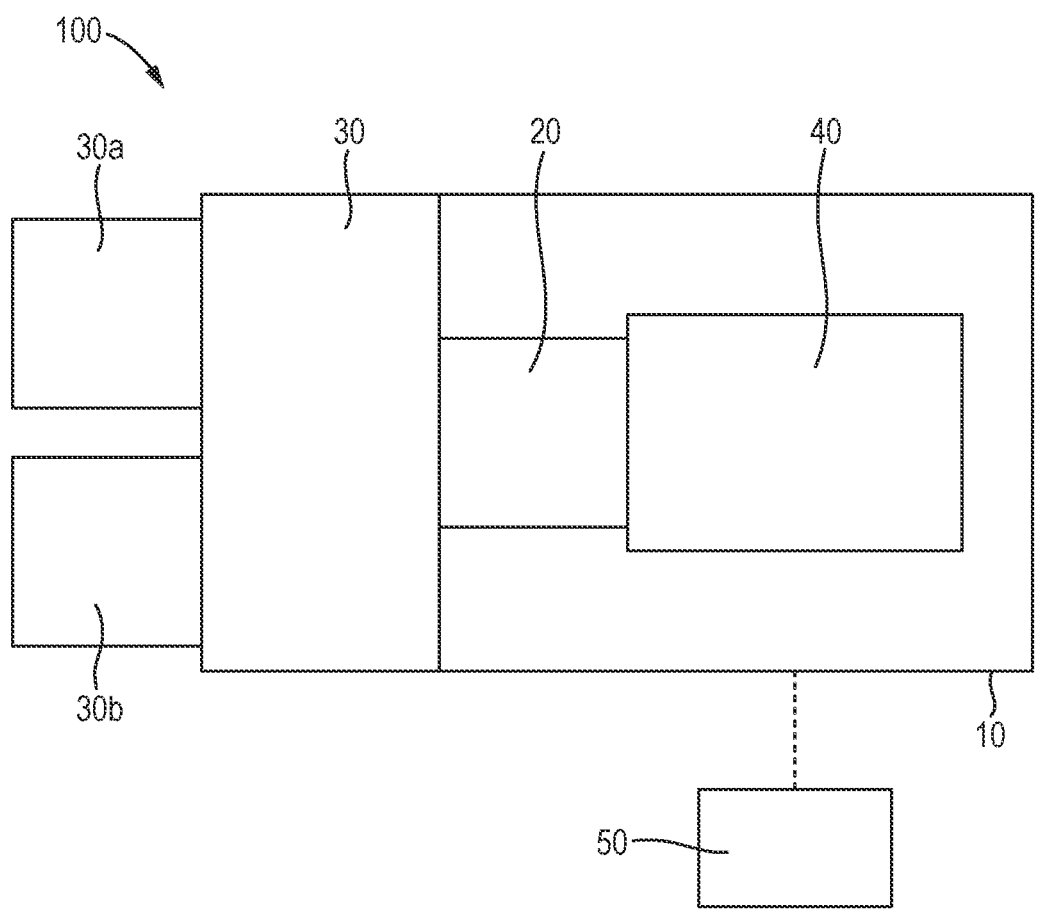
FIG. 1 is a schematic diagram illustrating an exemplary charged particle beam inspection apparatus.

The schematic diagrams and views show the components described below. However, the components depicted in the figures are not to scale.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with the disclosed embodiments.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000 the of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially true if operator intervention is required for reviewing the defects. Thus, high throughput detection and identification of micro and nano-scale defects by inspection tools (such as a Scanning Electron Microscope (SEW)) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical system, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. The electron beam tool 40 is located within the main chamber 10.

The EFEM 30 includes a first loading port 30a and a second loading port 30b. The EFEM 30 may include additional loading port(s). The first loading port 30a and the second loading port 30b may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in the EFEM 30 transport the samples to the load lock chamber 20.

The load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from the load lock chamber to the main chamber 10. The main chamber 10 is connected to a main chamber vacuum pump system (not shown). The main chamber vacuum pump system removes gas particles in the main chamber 10 so that the pressure in around the sample reaches a second pressure lower than the first pressure. After reaching the second pressure, the sample is transported to the electron beam tool 40 by which it may be inspected. An electron beam tool 40 may comprise a multi-beam electron-optical apparatus.

The controller 50 is electronically connected to the electron beam tool 40. The controller 50 may be a processor (such as a computer) configured to control the charged particle beam inspection apparatus 100. The controller 50 may also include a processing circuitry configured to execute various signal and image processing functions. While the controller 50 is shown in FIG. 1 as being outside of the structure that includes the main chamber 10, the load lock chamber 20, and the EFEM it is appreciated that the controller 50 may be part of the structure. The controller 50 may be located in one of the component elements of the charged particle beam inspection apparatus or it can be distributed over at least two of the component elements. While the present disclosure provides examples of the main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
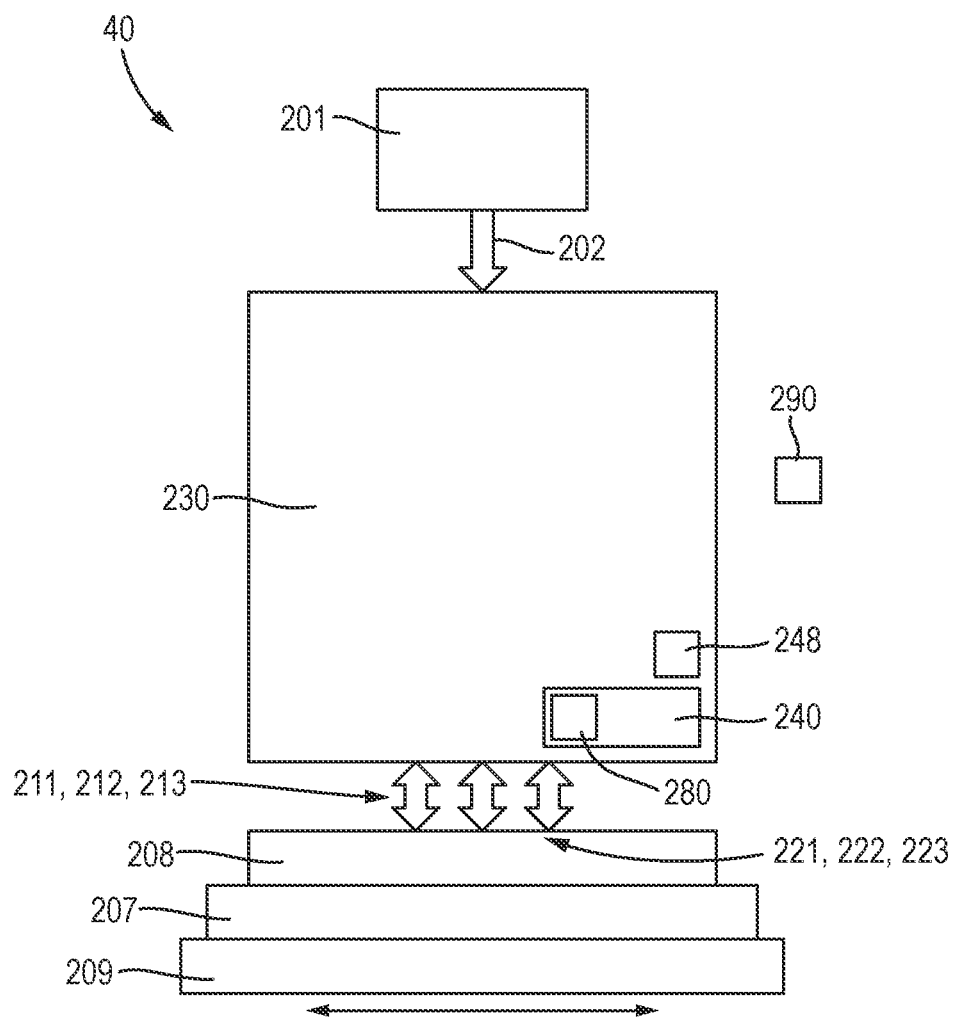
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. The multi-beam electron beam tool 40 (also referred to herein as apparatus 40) comprises an electron source 201, a projection apparatus 230, a motorized stage 209, and a sample holder 207. The electron source 201 and projection apparatus 230 may together be referred to as an illumination apparatus. The sample holder 207 is supported by motorized stage 209 so as to hold a sample 208 (e.g., a substrate or a mask) for inspection. The multi-beam electron beam tool 40 further comprises a detector array 240 (e.g. an electron detection device).

The electron source 201 may comprise a cathode (not shown) and an extractor or anode (not shown). During operation, the electron source 201 is configured to emit electrons as primary electrons from the cathode. The primary electrons are extracted or accelerated by the extractor and/or the anode to form a primary electron beam 202.

The projection apparatus 230 is configured to convert the primary electron beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beamlets.

The controller 50 may be connected to various parts of the charged particle beam inspection apparatus 100 of FIG. 1, such as the electron source 201, the detector array 240, the projection apparatus 230, and the motorized stage 209. The controller 50 may perform various image and signal processing functions. The controller 50 may also generate various control signals to govern operations of the charged particle beam inspection apparatus, including the charged particle multi-beam apparatus.

The projection apparatus 230 may be configured to focus sub-beams 211, 212, and 213 onto a sample 208 for inspection and may form three probe spots 221, 222, and 223 on the surface of sample 208. The projection apparatus 230 may be configured to deflect the primary sub-beams 211, 212, and 213 to scan the probe spots 221, 222, and 223 across individual scanning areas in a section of the surface of the sample 208. In response to incidence of the primary sub-beams 211, 212, and 213 on the probe spots 221, 222, and 223 on the sample 208, electrons are generated from the sample 208 which include secondary electrons and backscattered electrons.

The secondary electrons typically have electron energy ≤50 eV. Actual secondary electrons can have an energy of less than 5 eV, but anything beneath 50 eV is generally treated at a secondary electron. Backscattered electrons typically have electron energy between 0 eV and the landing energy of the primary sub-beams 211, 212, and 213. As electrons detected with an energy of less than 50 eV are generally treated as a secondary electron, a proportion of the actual backscatter electrons will be counted as secondary electrons. The secondary electrons may more generally be referred to, and are interchangeable with, secondary charged particles. The backscatter electrons may more generally be referred to, and are interchangeable with, backscatter charged particles. The skilled person would understand that the backscattered charged particles may more generally be described as secondary charged particles. However, for the purposes of the present disclosure, the backscattered charged particles are considered to be different from the secondary charged particles, e.g. having higher energies. In other words, the secondary charged particles will be understood to be particles having kinetic energy ≤50 eV and the backscatter charged particles will be understood to be particles having kinetic energy higher than 50 eV. The secondary charged particles and the backscatter charged particles are emitted from the sample. The charged particles emitted from the sample, e.g. the secondary electrons and backscattered electrons, may otherwise be referred to as signal particles, e.g. secondary signal particles and backscattered signal particles.

The detector array 240 is configured to detect secondary electrons and/or backscattered electrons and to generate corresponding signals which are sent to a signal processing system 280, e.g. to construct images of the corresponding scanned areas of sample 208. The detector array 240 may be incorporated into the projection apparatus 230.

The signal processing system 280 may comprise a circuit (not shown) configured to process signals from the detector array 240 so as to form an image. The signal processing system 280 could otherwise be referred to as an image processing system. The signal processing system may be incorporated into a component of the multi-beam electron beam tool 40 such as the detector array 240 (as shown in FIG. 2). However, the signal processing system 280 may be incorporated into any components of the inspection apparatus 100 or multi-beam electron beam tool 40, such as, as part of the projection apparatus 230 or the controller 50. The signal processing system 280 may include an image acquirer (not shown) and a storage device (not shown). For example, the signal processing system may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to the detector array 240 permitting signal communication, such as an electrical conductor, optical fiber cable, portable storage media, IR, Bluetooth, internet, wireless network, wireless radio, among others, or a combination thereof. The image acquirer may receive a signal from the detector array 240, may process the data comprised in the signal and may construct an image therefrom. The image acquirer may thus acquire images of the sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The signal processing system 280 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of the sample 208. The reconstructed images can thereby be used to reveal any defects that may exist in the sample.

The controller 50 may control the motorized stage 209 to move sample 208 during inspection of the sample 208. The controller 50 may enable the motorized stage 209 to move the sample 208 in a direction, preferably continuously, for example at a constant speed, at least during sample inspection. The controller 50 may control movement of the motorized stage 209 so that it changes the speed of the movement of the sample 208 dependent on various parameters. For example, the controller 50 may control the stage speed (including its direction) depending on the characteristics of the inspection steps of scanning process.

Known multi-beam systems, such as the electron beam tool 40 and charged particle beam inspection apparatus 100 described above, are disclosed in US2020118784, US20200203116 and US2019/0259564 which are hereby incorporated by reference.

In known single-beam systems, different signals (e.g. from secondary electron and/or backscatter electrons) might theoretically be detected. Multi-beam systems are known and are beneficial as the throughput can be much higher than when using single-beam systems, e.g. the throughput of a multi-beam inspection system may be 100 times higher than the throughput in a single-beam inspection system.

In known multi-beam systems, an array of primary electron beams of electrons at a relatively high energy are targeted with a final deceleration step in order to land on a sample at a relatively low landing energy for detection of secondary charged particles as mentioned above. However, in practice, it has not been possible to use multi beam inspection in combination with backscatter detection, or at least by direct backscatter detection, i.e. presently known multi-beam systems rely primarily on detection of secondary electrons.

Backscatter electrons have a large range of energies, typically between 0 eV and the landing energy. The backscatter electrons have a large range in energy (for example up to the landing energy of the primary electron beam) and wide angle of emitted backscattered charged particles. Secondary electrons typically have a more restricted energy range and tend to be distributed around an energy value. The large energy range and wide angle of emitted backscattered charged particles results in cross-talk in a multi-beam system. Cross-talk occurs when backscattered charged particles resulting from one primary sub-beam are detected at a detector assigned to a different sub-beam. Cross-talk generally occurs very close to the sample, i.e. proximate the sample onto which the primary beam is projected. Due to the cross-talk, previously known multi-beam assessment tools have not been able to effectively image backscatter signals. As a consequence, it has not been possible to increase the throughput for backscattered detection by using multi-beam systems.

As mentioned above, there are limitations in the information which can be obtained from secondary electrons. Imaging based on backscattered beams provides information about structures below the surface, such as buried defects. Additionally, backscatter signals can be used to measure overlay targets.

Through various techniques, it has been found that detection of backscattered charged particles is possible for multi-beam systems by controlling certain features. Thus, in the embodiments of the present disclosure, a charged particle optical device is provided which is capable of detecting backscattered charged particles. The backscattered electrons can be detected using a multi-beam array as in the present disclosure due to the detector array 240 being positioned proximate the sample 208. In being proximate to the sample 208, the detector array 240 may be considered to face the sample 208. It has been found that the device can be used to repel secondary charged particles from the detector which reduces the secondary charged particles detected when trying to image backscattered charged particles. Additionally or alternatively, it has been found that the device can be used to accelerate electrons onto the sample to generate an array of sub-beams with high landing energy. This is beneficial because higher landing energy allows the sub-beams to reach deeper into the substrate to inspect buried defects and measure overlay targets.

Components of an assessment tool 40, which may be used in embodiments of the present disclosure, are described below in relation to FIG. 3 which is a schematic diagram of an assessment tool 40. The charged particle assessment tool 40 of FIG. 3 may correspond to the multi-beam electron beam tool (also referred to herein as apparatus 40).

The electron source 201 directs electrodes toward an array of condenser lenses 231 (otherwise referred to as a condenser lens array) forming part of the projection system 230. The electron source 201 is desirably a high brightness thermal field emitter with a good compromise between brightness and total emission current. There may be many tens, many hundreds or many thousands of condenser lenses 231. The condenser lenses 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The array of condenser lenses 231 may take the form of at least two plates, acting as electrodes, with an aperture in each plate aligned with each other and corresponding to the location of a sub-beam. At least two of the plates are maintained during operation at different potentials to achieve the desired lensing effect.

In an arrangement the array of condenser lenses 231 is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect. More generally, the condenser lens array 231 may have two or more plate electrodes each with an array of apertures that are aligned. Each plate electrode array is mechanically connected to, and electrically isolated from, an adjacent plate electrode array by an isolating element, such as a spacer which may comprise ceramic or glass. The condenser lens array may be connected and/or spaced apart from an adjacent electron-optical element, preferably an electrostatic electron-optical element, by an isolating element such as a spacer as described elsewhere herein.

The condenser lenses are separated from a module containing the objective lenses (such as an objective lens array assembly as discussed elsewhere herein). In a case where the potential applied on a bottom surface of the condenser lenses is different than the potential applied on the top surface of the module containing the objective lenses an isolating spacer is used to space apart the condenser lenses and the module containing the objective lenses. In a case where the potential is equal then a conductive element can be used to space apart the condenser lenses and the module containing the objective lenses.

Each condenser lens 231 in the array directs electrons into a respective sub-beam 211, 212, 213 which is focused at a respective intermediate focus down beam of the condenser lens array. The respective sub-beams are projected along respective sub-beam paths 220. The sub-beams diverge with respect to each other. The sub-beam paths 220 diverge down beam of the condenser lenses 231. In some embodiments, deflectors 235 are provided at the intermediate focuses. The deflectors 235 are positioned in the sub-beam paths at, or at least around, the position of the corresponding intermediate focusses 233 or focus points (i.e. points of focus). The deflectors are positioned in or close to the sub-beam paths at the intermediate image plane of the associated sub-beam. The deflectors 235 are configured to operate on the respective sub-beams 211, 212, 213. The deflectors 235 are configured to bend a respective sub-beam 211, 212, 213 by an amount effective to ensure that the principal ray (which may also be referred to as the beam axis) is incident on the sample 208 substantially normally (i.e. at substantially 90° to the nominal surface of the sample). The deflectors 235 may also be referred to as collimators or collimator deflectors. The deflectors 235 in effect collimate the paths of the sub-beams so that before the deflectors, the sub-beam paths with respect to each other are diverging. Down beam of the deflectors the sub-beam paths are substantially parallel with respect to each other, i.e. substantially collimated. Suitable collimators are deflectors disclosed in EP Application 20156253.5 filed on 7 Feb. 2020 which is hereby incorporated by reference with respect to the application of the deflectors to a multi-beam array. The collimator may comprise a macro collimator 270, instead of, or in addition to the deflectors 235. Thus, the macro-collimator 270 described below in relation to FIG. 16 may be provided with the features of FIG. 3 or FIG. 4. This is generally less preferred than providing the collimator array as deflectors 235.

Below (i.e. down beam or further from source 201) the deflectors 235 there is a control lens array 250. The sub-beams 211, 212, 213 having passed through the deflectors 235 are substantially parallel on entry to the control lens array 250. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams. The control lens array 250 and the objective lens array 241 operate together to provide a combined focal length. Combined operation without an intermediate focus may reduce the risk of aberrations.

In further detail, it is desirable to use the control lens array 250 to determine the landing energy. However, it is possible to use in addition the objective lens array 240 to control the landing energy. In such a case, a potential difference over the objective lens is changed when a different landing energy is selected. One example of a situation where it is desirable to partly change the landing energy by changing the potential difference over the objective lens is to prevent the focus of the sub-beams getting too close to the objective lenses. In such a situation there is a risk of components of the objective lens array 241 having to be too thin to be manufacturable. The same may be said about a detector at this location. This situation can for example occur in case the landing energy is lowered. This is because the focal length of the objective lens roughly scales with the landing energy used. By lowering the potential difference over the objective lens, and thereby lowering the electric field inside the objective lens, the focal length of the objective lens is made larger again, resulting in a focus position further below the objective lens. Note that use of just an objective lens would limit control of magnification. Such an arrangement could not control demagnification and/or opening angle. Further, using the objective lens to control the landing energy could mean that the objective lens would be operating away from its optimal field strength. That is unless mechanical parameters of the objective lens (such as the spacing between its electrodes) could be adjusted, for example by exchanging the objective lens.

The control lens array 250 comprises a plurality of control lenses. Each control lens comprises at least two electrodes (e.g. two or three electrodes) connected to respective potential sources. The control lens array 250 may comprise two or more (e.g. three) plate electrode arrays connected to respective potential sources. Each plate electrode array is mechanically connected to, and electrically separated from, an adjacent plate electrode array by an isolating element, such as a spacer which may comprise ceramic or glass. The control lens array 250 is associated with the objective lens array 241 (e.g. the two arrays are positioned close to each other and/or mechanically connected to each other and/or controlled together as a unit). Each control lens may be associated with a respective objective lens. The control lens array 250 is positioned up-beam of the objective lens array 241.

The control lens array 250 comprises a control lens for each sub-beam 211, 212, 213. A function of the control lens array 250 is to optimize the beam opening angle with respect to the demagnification of the beam and/or to control the beam energy delivered to the objective lenses 234, each of which directs a respective sub-beam 211, 212, 213 onto the sample 208. The objective lenses may be positioned at or near the base of the electron-optical system. More specifically, the objective lens array may be positioned at or near the base of the projection system 230. The control lens array 250 is optional, but is preferred for optimizing a sub-beam upbeam of the objective lens array.

The control lens array 250 may be considered as providing electrodes additional to the electrodes of the objective lens array 241 for example as part of the objective lens array assembly (or objective lens arrangement). The additional electrodes of the control lens array 250 allow further degrees of freedom for controlling the electron-optical parameters of the sub-beams. In some embodiments, the control lens array 250 may be considered to be additional electrodes of the objective lens array 241 enabling additional functionality of the respective objective lenses of the objective lens array 241. In an arrangement such electrodes may be considered part of the objective lens array providing additional functionality to the objective lenses of the objective lens array 241. In such an arrangement, the control lens is considered to be part of the corresponding objective lens, even to the extent that the control lens is only referred to as being a part of the objective lens.

Figure 3:
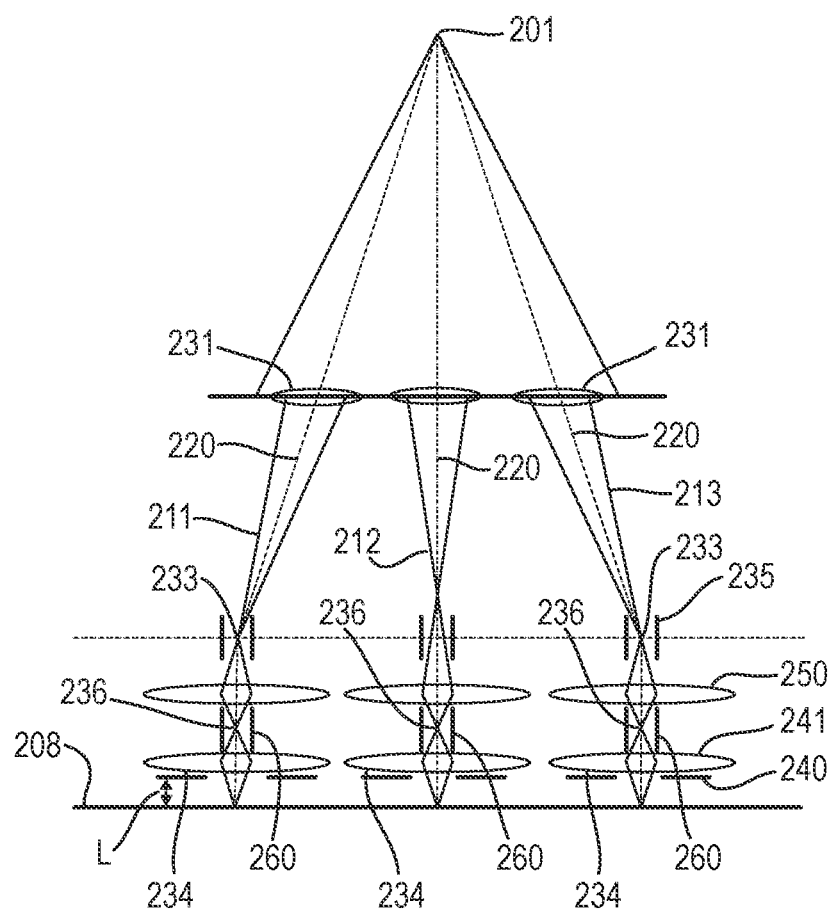
FIG. 3 is a schematic diagram of an exemplary multi-beam apparatus, according to some embodiments of the present disclosure.

For ease of illustration, lens arrays are depicted schematically herein by arrays of oval shapes (as shown in FIG. 3). Each oval shape represents one of the lenses in the lens array. The oval shape is used by convention to represent a lens, by analogy to the biconvex form often adopted in optical lenses. In the context of charged-particle arrangements such as those discussed herein, it will be understood however that lens arrays will typically operate electrostatically and so may not require any physical elements adopting a biconvex shape. Lens arrays may instead comprise multiple plates with apertures.

Optionally, an array of scan deflectors 260 is provided between the control lens array 250 and the array of objective lenses 234. The array of scan deflectors 260 comprises a scan deflector for each sub-beam 211, 212, 213. Each scan deflector is configured to deflect a respective sub-beam 211, 212, 213 in one or two directions so as to scan the sub beam across the sample 208 in one or two directions.

Figure 5:
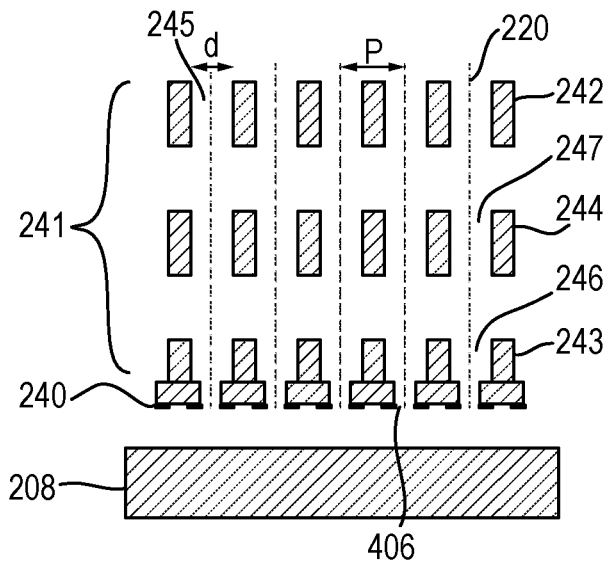
FIG. 5 is a schematic cross-sectional view of an objective lens of an inspection apparatus, according to some embodiments of the present disclosure.
Figure 6:
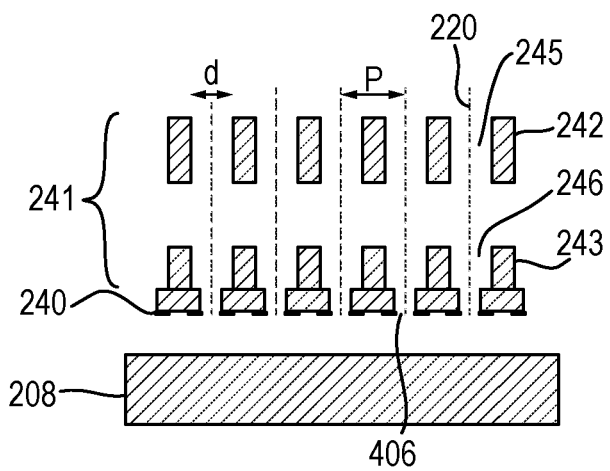
FIG. 6 is a schematic cross-sectional view of an objective lens of an inspection apparatus, according to some embodiments of the present disclosure.

The objective lens array 241 may comprise at least two electrodes in which are defined aperture arrays. In other words, the objective lens array comprises at least two electrodes with a plurality of holes or apertures. FIG. 5 and FIG. 6 show electrodes 232, 243, 244 which are part of an exemplary objective lens array 241 having respective aperture arrays 245, 246, 247. The position of each aperture in an electrode corresponds to the position of a corresponding aperture in another electrode. The corresponding apertures operate in use on the same beam, sub-beam or group of beams in the multi-beam. In other words, corresponding apertures in the at least two electrodes are aligned with and arranged along a sub-beam path, i.e. one of the sub-beam paths 220. In each electrode is a plurality of apertures. The aperture in an electrode is aligned with a corresponding aperture in all or each of the other electrodes. A sub-beam path through an aperture in an electrode passes through all the corresponding apertures electrodes in the other electrodes. Such an aperture in the electrode is aligned with the corresponding apertures in the other electrodes, Thus all of the apertures of the aperture array in an electrode are aligned with corresponding apertures of the aperture arrays in the other electrodes, Thus the aperture arrays in the plurality of electrodes are aligned. Thus, the electrodes are each provided with apertures through which the respective sub-beam 211, 212, 213 propagates.

The objective lens array 241 may comprise two or three electrodes, as shown in FIG. 5 and FIG. 6 respectively, or may have more electrodes (not shown). An objective lens array 241 having only two electrodes can have lower aberration than an objective lens array 241 having more electrodes. A three-electrode objective lens can have greater potential differences between the electrodes and so enable a stronger lens. Additional electrodes (i.e. more than two electrodes) provide additional degrees of freedom for controlling the electron trajectories, e.g. to focus secondary electrons as well as the incident beam. A benefit of two electrode lens over an Einzel lens is that the energy of an in-coming beam is not necessarily the same as an out-going beam. Beneficially the potential differences on such a two electrode lens array enables it to function as either an accelerating or a decelerating lens array.

Adjacent electrodes of the objective lens array 241 are spaced apart from each other along the sub-beam paths. The distance between adjacent electrodes, in which an insulating structure might be positioned as described below, is larger than the objective lens.

Preferably, each of the electrodes provided in the objective lens array 241 is a plate. The electrode may otherwise be described as a flat sheet. Preferably, each of the electrodes is planar. In other words, each of the electrodes will preferably be provided as a thin, flat plate, in the form of a plane. Of course, the electrodes are not required to be planar. For example, the electrode may bow due to the force due to the high electrostatic field. It is preferable to provide a planar electrode because this makes manufacturing of the electrodes easier as known fabrication methods can be used. Planar electrodes may also be preferable as they may provide more accurate alignment of apertures between different electrodes.

The objective lens array 241 can be configured to demagnify the charged particle beam by a factor greater than 10, desirably in the range of 50 to 100 or more.

A detector array 240 is provided to detect secondary and/or backscattered charged particles emitted from the sample 208. The detector array 240 is positioned between the objective lenses 234 and the sample 208. The detector array may otherwise be referred to as a sensor array, and the terms "detector" and "sensor" are used interchangeably throughout the application.

Figure 4:
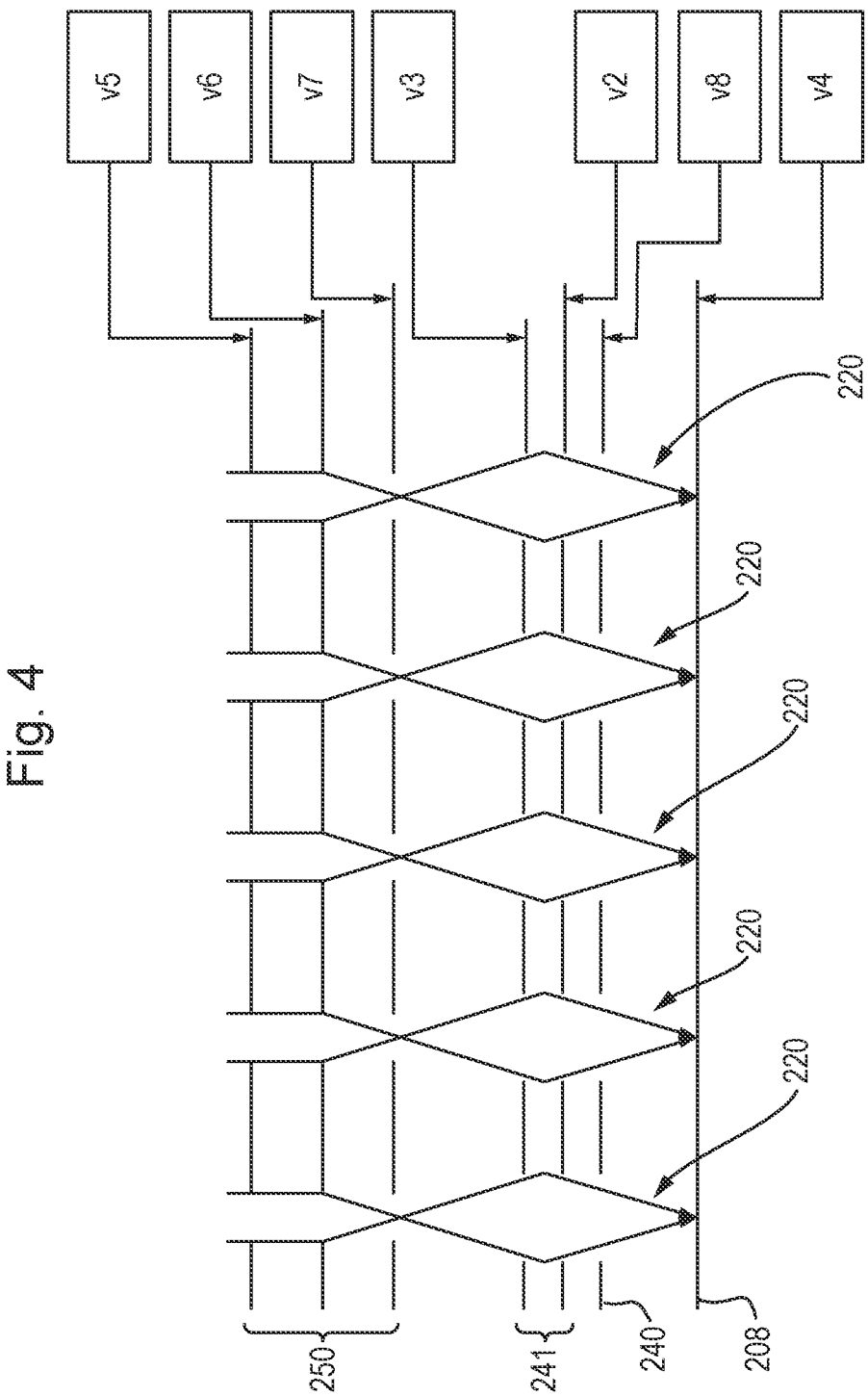
FIG. 4 is a schematic diagram of an exemplary charged particle optical device, according to some embodiments of the present disclosure.

In some embodiments, a charged particle-optical device is provided. The charged particle optical device is configured to detect backscattered charged particles. The charged particle optical device is suitable for any charged particle system, e.g. a charged particle assessment tool as shown in FIG. 3. The charged particle assessment tool may be an example of a charged particle system, and any reference to the charged particle assessment tool may be interchangeable with the charged particle system. Thus, the charged particle optical device may be used as part of such a charged particle assessment tool. The charged particle-optical device may include at least one, some, or all of the features of the charged particle assessment tool 40. An example of the charged particle-optical device is shown in FIG. 4. As depicted, the charged particle device may comprise a controller array 250, an objective lens array 241 and a detector array 240. In FIG. 4, multiple lenses of each array are depicted, for example, with any of sub-beams 211, 212, 213 passing through the lenses as shown. Although FIG. 4 depicts five lenses, any appropriate number may be provided; for example, in the plane of the lenses, there may be 100, 1000 or of the order of 10,000 lenses. Features that are the same as those described above are given the same reference numerals. For conciseness, the description of these features provided above applies to the features shown in FIG. 4. The charged particle optical device may comprise one, some or all of the components shown in FIG. 4. Note that this figure is schematic and may not be to scale. For example, in a non-limited list: the sub-beams may be narrower at the controller array 250 than at the objective lens array 241; the detector array 240 may be closer to the electrodes of the objective lens array 241 than the electrodes of the objective lens array 241 are to each other; and a focus point of each sub-beam between the controller lens array 250 may be closer to the objective lens array 241 than depicted.

FIG. 4 is an enlarged schematic view of multiple objective lenses of the objective lens array 241 and multiple control lenses of the control lens array 250. As described in further detail below, the lens arrays can be provided by electrodes with a selected potential applied to the electrode. Spacing between electrodes of the control lens array 250 may be larger than spacing between electrodes of the objective lens array 241 as shown in FIG. 4, but this is not a necessity. Voltage sources V3 and V2 (which may be provided by individual electric power sources or may all be supplied by electric power source 290) are configured to apply potentials to the upper and lower electrodes of the objective lens array 241 respectively. Voltage sources V5, V6, V7 (which may be provided by individual electric power sources, or may all be supplied by electric power source 290) are configured to apply potentials to the first, second and third electrodes of the control lens array 250 respectively. A further voltage source V4 is connected to the sample to apply a sample potential. A further voltage source V8 is connected to the detector array to apply a detector array potential. Although the control lens array 250 is shown with three electrodes, the control lens array 250 may be provided with two electrodes (or more than three electrodes). Although the objective lens array 240 is shown with two electrodes, the objective lens array 240 may be provided with three electrodes (or more than three electrodes). For example, a middle electrode may be provided in the objective lens array 241 between the electrodes shown in FIG. 4 with a corresponding voltage source.

Figure 16:
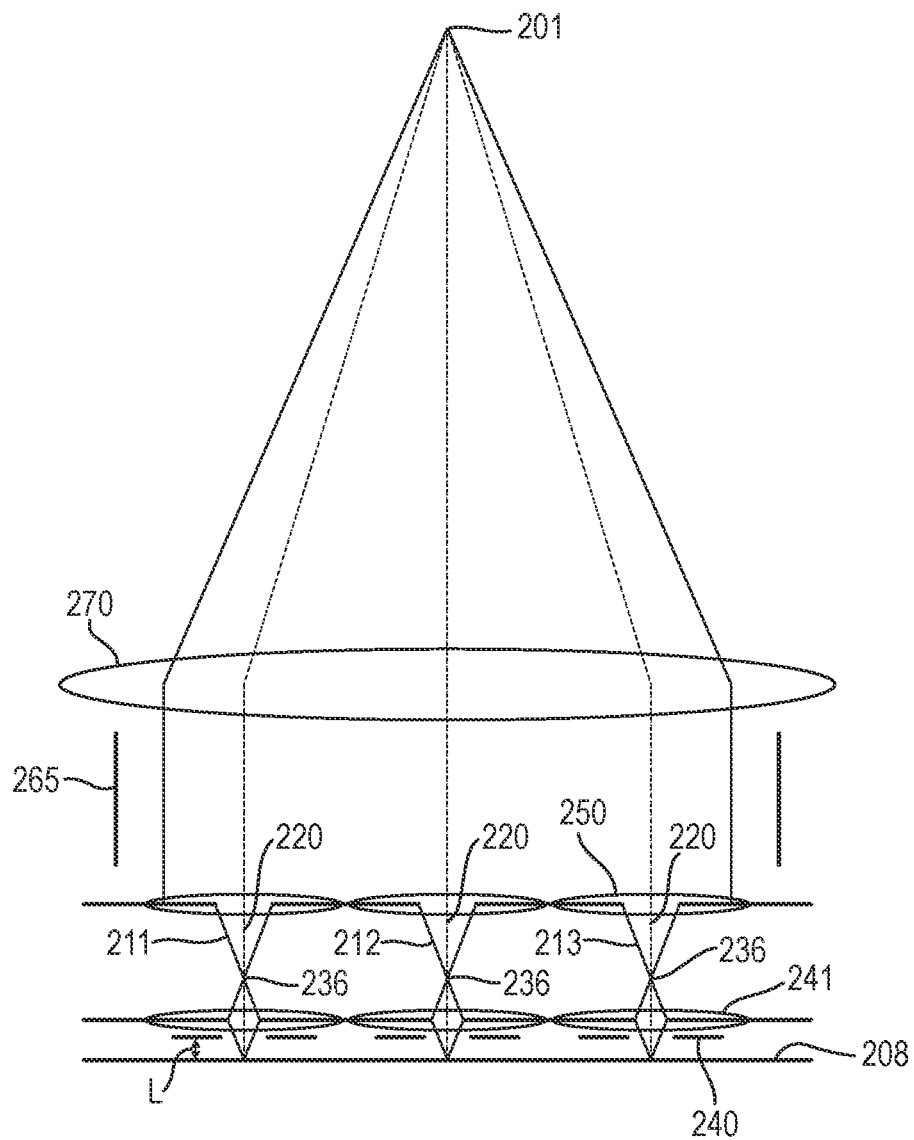
FIG. 16 is a schematic diagram of an exemplary electron-optical system comprising a macro collimator and macro scan deflector, according to some embodiments of the present disclosure.

As shown in FIG. 4, the sub-beams may be parallel on entry into the control lens array 250, as shown in FIG. 3. However, the same components of FIG. 4 may be used in a configuration as shown in FIG. 16, in which case, the sub-beams may be separated on entry into the control lens array 250 as shown in FIG. 16.

The control lens array electrodes may be spaced a few millimeters (e.g. 3 mm) apart. The spacing between the control lens array 241 and the objective lens array 250 (i.e. the gap between lower electrode of the control lens array 250 and the upper electrode of the objective lens 241) can be selected from a wide range, e.g. from 2 mm to 200 mm or more. A small separation makes alignment easier whereas a larger separation allows a weaker lens to be used, reducing aberrations.

Desirably, the potential V5 of the uppermost electrode of the control lens array 250 is maintained the same as the potential of the next electron-optic element up-beam of the control lens (e.g. deflectors 235). The potential V7 applied to the lower electrode of the control lens array 250 can be varied to determine the beam energy. The potential V6 applied to the middle electrode of the control lens array 250 can be varied to determine the lens strength of the control lens and hence control the opening angle and demagnification of the beam. It should be noted that even if the landing energy does not need to be changed, or is changed by other means, the control lens can be used to control the beam opening angle. The position of the focus of a sub-beam is determined by the combination of the actions of the respective control lens array 250 and the respective objective lens 240.

In some embodiments, a charged particle optical device for the charged particle assessment tool 40 is provided, or more generally, a charged particle-optical device for a charged particle system. The charged particle optical device is referred to below as the device. The device is configured to project a multi-beam of charged particles along sub-beam paths 220 towards the sample 208. The multi-beam comprises sub-beams, such as sub-beams 211, 212, 213. The sub-beams may otherwise be referred to as beams, for example, an array of primary beams. In other words, the device is configured to project an array of beams of charged particles towards a sample. The device comprises the objective lens array 241, which comprises a plurality of objective lenses 234 and can otherwise be referred to as an array of objective lenses. The objective lens array 241 is configured to project an array of charged particle sub-beams 211, 212, 213 onto the sample 208. The array of objective lenses (i.e. the objective lens array 241) may correspond with the array of detectors (i.e. the detector array 240) and/or any of the sub-beams. Each element in the objective lens array 240 may be a micro-lens operating a different beam or group of beams in the multi-beam. The objective lens array 241 may be configured to accelerate the charged particles towards the sample 208. In other words, the objective lenses 234 may be configured to accelerate the charged particle sub-beams 211, 212, 213 along the sub-beam paths 220.

The device comprises the detector array 240, otherwise referred to as an array of detectors. The detector array 240 is configured to capture charged particles emitted from the sample 208. The detector array is configured to detect backscatter particles from the sample 208. The detector array 240 may be may be configured to detect primarily backscattered charged particles. In other words, the detector array 240 may be configured to detect mostly backscattered charged particles. The detector array 240 may be configured to detect more backscattered charged particles than secondary charged particles. As described further below, the device is beneficial in that it provides a multi-beam tool which can be used to detect directly backscattered charged particles emitted from the sample 208. Thus, the backscatter charged particles may be detected directly from the surface of the sample 208. The backscatter charged particles may be detected without having to be converted, for example, into another type of signal particle such a secondary charged particle which may be easier to detect. Thus, the backscatter charged particles may be detected by the detector array 241 without encountering, e.g. hitting, any other components or surfaces between the sample 208 and the detector array 241.

The detector array 240 comprises a plurality of detectors. Each detector is associated with a corresponding sub-beam (which may otherwise be referred to as a beam or primary beam). In other words, the arrays of detectors (i.e. the detector array 240) and sub-beams correspond. Each detector may be assigned to a sub-beam. The array of detectors may correspond with the array of objective lenses. In other words, the array of detectors may be associated with the corresponding array of objective lenses. The embodiments of the present disclosure enable the risk of cross-talk of detection of backscatter charged particles derived from a sub-beam detected by a detector of the detector array associated with a different sub-beam of the array of sub-beams can be reduced if not avoided. A detector array 240 is described below. However, any reference to detector array 240 could be replaced with a single detector (i.e. at least one detector) or multiple detectors as appropriate. The detectors may otherwise be referred to as of detector elements 405 (e.g. sensor elements such as capture electrodes). The detectors may be any appropriate type of detector. For example, capture electrodes for example to detect directly electron charge, scintillators or PIN elements can be used The detector may be a direct current detector or an indirect current detector. The detector may be a detector as described below in relation to FIG. 7, FIG. 8, FIG. 9, FIG. 13, FIG. 14, and FIG. 15.

It should be noted that scintillators and PIN elements typically detect signal particles above an energy threshold. Since secondary electrons have a low energy of close to 0 eV, e.g. 50 eV, it would be understood by a person skilled in the art for such scintillators and PIN elements could not to detect secondary electrons of such an energy. For these types of detector element to detect such electrons such a detector element should be positioned at a location in the electron-optical column at which such secondary electrons have sufficient energy for their detection, for example above the electrodes furthest down beam in a decelerating objective lens, or at least the down-beam most of the electrodes defining a decelerating objective lens arrangement, see for example EP Application number 20198201.4 which is hereby incorporated by reference at least so far as the disclosure of in lens sensor units and detectors, The detector array 240 is positioned between the control lens array 250 and the sample 208. The detector array is positioned between the objective lens array 241 and the sample 208. The detector array 240 is configured to be proximate the sample. The detector array 240 may be proximate the sample so as to detect backscatter particles from the sample 208. The detector being proximate the sample enables the risk of cross-talk in detection of backscatter charged particles generated by sub-beams which correspond to another detector in the detector array to be reduced if not avoided. In other words, the detector array 240 is very close to the sample 208. The detector array 240 may be within a certain distance of the sample 208, as described below. The detector array 240 may be adjacent to the sample 208. The at least one detector may be positioned in the device so as to face the sample. That is the detector may provide a base to the device. The detector as part of the base may face a surface of the sample. This may be beneficial in positioning the at least one detector in a location in which the at least one detector is more likely to detect backscattered particles than secondary particles. For example, the at least one detector array may be provided on an output side of the objective lens array 241. The output side of the objective lens array 241 is the side on which the sub-beams are output from the objective lens array 241, i.e. the bottom or downbeam side of the objective lens array in the configuration shown in FIG. 4, FIG. 5 and FIG. 6. In other words, the detector array 240 may be provided downbeam of the objective lens array 241. The detector array may be positioned on, or adjacent to, the objective lens array. The detector array 241 may be an integral component of the objective lens array 241. The detector and objective lens may be part of the same structure. The detector may be connected to the lens by an isolating element or directly to an electrode of the objective lens. Thus, the at least one detector may be part of an objective lens assembly comprising at least the objective lens array and the detector array. If the detector array is an integral component of the objective lens array 241, the detector array 240 may be provided at the base of the objective lens array 241. In an arrangement the detector array 240 may be integral to the most-down-beam positioned electrode of the objective lens array 241.

Ideally, the detector array is as close as possible to the sample. The detector array 240 is preferably very close to the sample 208 such that there is a proximity focus of backscattered charged particles at the detector array. As previously described, the energy and angular spread of the backscattered charged particles is generally so large that it is difficult (or impossible in known prior art systems) to keep the signals from neighboring beams separated. However, the proximity focus means that backscattered charged particles can be detected at a relevant one of the detectors without cross-talk (i.e., interference from neighboring beams). Of course, there is a minimum distance between the sample 208 and the detector array 240. However, it is preferable to reduce this distance as much as possible. Certain configurations may benefit from reducing the distance even more than others.

Preferably, a distance 1' as shown in FIG. 3, between the detector array 240 and the sample 208 is less than or equal to approximately 50 μm, i.e. the detector array 240 is positioned within approximately 50 μm from the sample 208. The distance L is determined as the distance from a surface of the sample 208 facing the detector array 240 and a surface of the detector array 241 facing the sample 208. Preferably, the detector array 240 is positioned within approximately 40 μm of the sample 208, i.e. the distance L between the detector array 240 and the sample 208 is less than or equal to approximately 40 μm. Preferably, the detector array 240 is positioned within approximately 30 μm of the sample 208, i.e. the distance L between the detector array 240 and the sample 208 is less than or equal to approximately 30 μm. Preferably, the detector array 240 is positioned within approximately 20 μm of the sample 208, i.e. the distance L between the detector array 240 and the sample 208 is less than or equal to approximately 20 μm. Preferably, the detector array 240 is positioned approximately 10 μm of the sample 208, i.e. the distance L between the detector array 240 and the sample 208 is approximately less than or equal to 10 μm.

Providing a distance of approximately 50 μm or less is beneficial in that cross-talk between backscattered electrons can be avoided or minimized. Therefore, the distance L is preferably kept low, i.e. approximately 50 μm or less. Theoretically, there may be a lower limit of how close the sample 208 and the detector array 240 can be whilst allowing these components to move relative to each other and this may mean that the distance L might be more than approximately 5 μm or 10 μm.

For example, a distance L of approximately 50 μm or less may be used whilst still allowing relatively reliable control of the device as shown as part of the tool in FIG. 3. A distance L of approximately 30 μm or less may be preferable for other configurations, such as those shown and described in relation to FIG. 16 below.

A preferred range of the distance L between the detector array 240 and the sample 208 may be between approximately 5 μm to 50 μm, or preferably between approximately 10 μm to 50 μm, or preferably between approximately 30 μm to 50 µm. In an arrangement the detector array 240 may be actuatable relative to the objective lens array 241, i.e. to vary the distance L, for example to substantially maintain a distance between the sample and the detector array L.

The detector array 240 may be part of the objective lens assembly. An example of detector array 240 integrated into an objective lens array is shown in FIG. 5 which illustrates a portion of the objective lens array 240 in schematic cross section. In this example, the detector array 240 comprises a plurality of detector elements 405 (e.g., sensor elements such as capture electrodes). As discussed above, the device may be configured to repel secondary charged particles emitted from the sample 208 towards the detector array 240. More specifically, the detector array 240 may be configured to repel secondary charged particles emitted from the sample 208. The detector array 240 may be configured to repel charged particles by controlling a potential of the detector array 240. This is beneficial as it reduces the number of secondary charged particles emitted from the sample 208 which travel back towards the detector array 240.

The detector array 240 may be configured in use to have a potential, referred to herein as a detector array potential. The sample 208 may be configured in use to have a potential, referred to herein as a sample potential. The sample potential may be more positive than the detector array potential. The difference in potential between the detector array 240 and the sample 208 repels charged particles emitted from the sample 208 from heading towards the detector array 240. Preferably, the detector array potential may be the same as the second electrode potential (i.e. the potential of the downbeam electrode of the objective lens array).

The potential difference between the sample potential and the detector array potential is preferably relatively small so that charged particle sub-beams are projected through or past the detector array 240 to the sample 208 without being significantly affected. The potential difference between the sample potential and the detector array potential is preferably greater than a secondary electron threshold. The secondary electron threshold is the potential difference equivalent to the likely electron energy of a secondary electron emanating from the sample 208. That is the relatively small potential difference between the sample and detector array potentials is sufficient to repel the secondary electrons from the detector array. For example, the potential difference between the sample potential and the detector array potential may be approximately 20 V, 50 V, 100 V, 150 V or 200 V.

Preferably, the potential difference between the detector array potential and the sample potential is small. This means that, advantageously, the potential difference will have a negligible effect on the path of a backscattered charged particle (which generally has a greater energy up to the landing energy), meaning that the backscattered electrons can still be detected whilst reducing or avoiding detection of secondary charged particles. Thus, the small difference between the detector array potential and the sample potential is effectively an energy barrier which allows backscatter charged particles to be detected whilst also making sure that detection of secondary charged particles is reduced or avoided.

For example, the detector array potential may be greater than approximately +10 kV up to approximately +100 kV, or preferably between approximately +20 kV to +100 kV relative to a source of the charged particle beam. Preferably, the detector array potential is between approximately +20 kV to +70 kV relative to a source of the charged particle beam.

Although it is described elsewhere that part of the device may be configured to repel the secondary charged particles, this will generally be done by the detector array 240. The detector array and the lowermost electrode of the objective lens array 241 may both theoretically have a repellant effect on the secondary charged particles emitted from the sample returning towards the detector array 240. However, as the detector array 240 is closer to the sample 208 than the objective lens array 241, it is the detector array 240 which will generally provide the repelling force on the secondary charged particles.

The aperture arrays 245, 246, 247 of the objective lens array 241 may consist of a plurality of apertures, preferably with substantially uniform diameters, d. However there may be some variation for optimizing aberration correction as described in EP Application 20207178.3 filed on 12 Nov. 2020 which is herein incorporated by reference at least with respect to corrections achieved by varying aperture diameter. The diameter, d, of the apertures in at least one electrode may be less than approximately 400 µm. Preferably, the diameter, d, of the apertures in at least one electrode is between approximately 30 to 300 µm. Smaller aperture diameters may provide larger detectors for a given aperture pitch, improving the chance of capturing backscatter charged particles. Thus the signal for the backscattered charged particles may improve. However, having apertures that are too small risk inducing aberrations in the primary sub-beams.

The plurality of apertures in an electrode may be spaced apart from each other by a pitch, p. The pitch is defined as the distance from the middle of one aperture to the middle of an adjacent aperture. The pitch between adjacent apertures in at least one electrode may be less than approximately 600 µm. Preferably, the pitch between adjacent apertures in at least one electrode is between approximately 50 µm and 500 µm. Preferably, the pitch between adjacent apertures on each electrode is substantially uniform.

The backscatter electrons are emitted from the sample 208 with a very large energy spread, and typically with an angular spread following a cosine distribution. The further the distance from sample 208 to the detector array 240, the larger the cone of the emitted beam becomes. Because of the very large energy spread it may not be possible to image the backscattered charged particles coming from the different beams onto a detector without introducing significant cross talk. The solution is to place the detector in close proximity to the substrate and choose the pitch of the beams such that the backscatter charged particle signals of the neighboring beams to not overlay.

Thus, the pitch size may be selected depending on the distance between the detector array 240 and the sample 208 (or vice versa). For example only, for a distance L between the sample 208 and the detector array 240 of approximately 50 micron, the beam pitch p may be equal to or larger than approximately 300 micron. For example only, for a distance L between the sample 208 and the detector array 240 of approximately 10 micron, the beam pitch p may be equal to or larger than approximately 60 micron. Providing a closer detector array allows use of a smaller beam pitch p. This may be beneficial in using certain configurations in which the beam pitch is beneficially smaller, such as the configuration described in relation to, and shown in, FIG. 16 below.

The values for the diameter and/or pitch described above can be provided in at least one electrode, multiple electrodes, or all electrodes in an objective lens array. Preferably, the dimensions referred to and described apply to all electrodes provided in an array of objective lenses.

The objective lens array 241 may comprise the first electrode 242 with the first aperture array 245 and the second electrode 243 with the second aperture array 246. The first electrode 242 may be up-beam of a second electrode 243, as shown in FIG. 5 and FIG. 6. Up-beam may be defined as being closer to the source 201. Up-beam may otherwise be defined as further from the sample 208. The first electrode 242 may be referred to as the upper electrode. The second electrode 243 may be referred to as the lower electrode.

Additional electrodes may be included as part of the objective lens array. The additional electrodes may be positioned between the first electrode and the second electrode. In other words, the first electrode 242 and the second electrode 243 may be outer electrodes. The first electrode 242 may be positioned up-beam of any other electrode included in the objective lens array 241. The second electrode 243 may be positioned down-beam of any other electrodes included in the objective lens array 241. As shown in FIG. 5, a third electrode 244 may be provided with a third aperture array 247. The third electrode 244 may be a middle electrode.

As described above, a voltage source may be provided to the electrodes of the objective lens array such that the electrodes each have a potential. The first electrode 242 may be configured in use to have a first electrode potential and/or the second electrode 243 may be configured in use to have a second electrode potential. Additionally or alternatively, the sample 208 may be configured in use to have the sample potential.

As described above, accelerating the sub-beams 211, 212, 213 projected onto the sample 208 is beneficial in that it can be used to generate an array of sub-beams with high landing energy. The potentials of the electrodes of the objective lens array can be selected to provide acceleration through the objective lens array 241.

The potentials and the values of the potentials defined herein are defined with respect to the source; hence the potential of a charged particle at the surface of the sample may be referred to as a landing energy because the energy of a charged particle correlates to the potential of the charged particle and the potential of the charged particle at the sample is defined with respect to the source. However, as the potentials are relative values, the potentials could be defined relative to other components, such as the sample. In this instance, the difference in potential applied to different components would preferably be as discussed below with respect to the source. The potentials are applied to the relevant components, such as the electrodes and the samples during use, i.e. when the device is being operated.

Preferably, the potential of the second electrode 243 (i.e. the second electrode potential) is more positive than the potential of the first electrode 242 (i.e. the first electrode potential). This is beneficial in accelerating the charged particle from the first electrode 242 towards the second electrode 243. In other words, the difference in potential of the electrodes can be used to accelerate the charged particle in the objective lens array 241.

Preferably, the second electrode potential is substantially the same as the detector array potential.

Preferably, the sample potential is more positive than potential of the first electrode (i.e. the first electrode potential). This is beneficial in accelerating the charged particle from the first electrode 242 towards the sample 208.

Preferably, the sample potential is more positive than the potential of the second electrode (i.e. the second electrode potential). This is beneficial in accelerating the charged particle from the second electrode towards the sample.

Additionally, this is beneficial in that the charged particles are more attracted to the sample 208 than the second electrode 243 of the objective lens array 241. This has the effect of repelling charged particles emitted from the sample 208 away from a path towards the second electrode 243, i.e. towards the detector array 240 as described above.

The device may be configured to repel secondary charged particles from a downbeam electrode of the objective lens array 241. The downbeam electrode of the objective lens array 241 may be the part of the objective lens array 241 which is positioned furthest along the beam, i.e. downbeam/furthest from the source 201 when in use. In this instance, the device may be configured to repel secondary electrons from the detector array 241 (using the objective lens array 240) so that the detector array 240 can more effectively detect the backscatter charged particles over the secondary electrons, i.e. by reducing or preventing secondary charged particles being detected.

As discussed above, it is preferable for at least the second electrode potential to be more positive than the first electrode potential as this accelerates the charged particle projected in the objective lens assembly 241. When the first electrode potential is lower, then a bigger difference in potential can be provided between the first electrode and the second electrode. A greater difference between the first and second electrode potential will result in a larger acceleration. Therefore, the first electrode potential is preferably relatively low. However, if the first electrode potential is too small, for example, less than +2 kV or less than +3 kV, then it has been found that focus of the charged particle sub-beams may be formed inside the objective lens array 241. Therefore, the value of the first electrode is selected to be small, without resulting in the formation of the focus within the objective lens array. For example, the potential of the first electrode may be between approximately +1 kV to +10 kV relative to a source of the charged particle beam. For example, the potential of the first electrode may be between approximately +3 kV to +8 kV relative to a source of the charged particle beam. Preferably, the potential of the first electrode is approximately +5 kV relative to a source of the charged particle beam.

The potential of the second electrode may be more positive than the first electrode potential to accelerate the charged particle. Therefore, it is preferable for the second electrode potential value to be relatively large. The second electrode potential value may be greater than approximately +10 kV up to approximately +100 kV, or preferably between approximately +20 kV to +100 kV relative to a source of the charged particle beam. Preferably, the potential of the second electrode is between approximately +20 kV to +70 kV relative to a source of the charged particle beam.

As mentioned above, the sample potential is preferably more positive than the second electrode potential because this repels secondary charged particles from the objective lens array 241. However, as the particles are being accelerated from the first electrode and through the second electrode to the sample, it is beneficial in keeping the value of the sample potential similar to the value of the second electrode potential so that the charged particles are accelerated to the surface of the sample 208. That is the difference in potential between the second and sample potential is relatively small, but sufficient for the charged particles to be accelerated towards the sample. The sample potential may be greater than approximately +10 kV up to approximately +100 kV, or preferably may be between approximately +20 kV to +100 kV relative to a source of the charged particle beam. Preferably, the potential of the sample is approximately +20 kV to +70 kV relative to a source of the charged particle beam. Preferably, the sample potential is approximately 10V, 20 V, 50 V, 100 V, 150 V or 200 V more positive than the second electrode potential.

The potential difference between the sample potential and the second electrode potential preferably greater than a secondary electron threshold. The secondary electron threshold is the potential difference equivalent to the likely electron energy of a secondary electron emanating from the sample. That is the relatively small potential difference between the sample potential and second electrode potential is sufficient to repel the secondary electrons from the detector array. For example, the potential difference between the sample potential and the bottom electrode potential may be approximately 10V, 20 V, 50 V, 100 V, 150 V or 200 V.

For example, the device being configured to accelerate the charged particle sub-beams and repel the secondary charged particles as described above may have potentials as shown in the context of FIG. 4 with the values in Table 1 below. As mentioned above, the objective lens array as shown in FIG. 4 may comprise an additional electrode, e.g. a middle electrode positioned between the upper electrode (first electrode) and lower electrode (second electrode) of the objective lens array 241 as shown in FIG. 4. A voltage source V1 (not shown) may be configured to apply a potential to the middle electrode. This middle electrode is optional and may not be included with the electrodes having the other potentials listed in Table 1. The middle electrode of the objective lens array may have the same potential as the upper electrode of the objective lens array (i.e. V3).

Exemplary ranges are shown in the left hand column of Table 1 as described above. The middle and right hand columns show more specific example values for each of V1 to V8 within the example ranges. The middle column may be provided for a smaller resolution than the right hand column. If the resolution is larger (as in the right hand column), the current per sub-beam is larger and therefore, the number of beams may be lower. The advantage of using a larger resolution is that the time needed to scan a "continuous area" is shorter (which can be a practical constraint). So the overall throughput may be lower, but the time needed to scan the beam area is shorter (because the beam area is smaller).

TABLE 1

| | | | |
|---|---|---|---|
| Landing Energy | >10-100 keV | 30 keV | 30 keV |
| V1 (or omitted) | 1-10 keV | 5 keV | 5 keV |
| V2 | >10-100 keV | 29.95 keV | 29.95 keV |
| V3 | 1-10 keV | 5 keV | 5 keV |
| V4 | >10-100 keV | 30 keV | 30 keV |
| V5 | >10-100 keV | 30 keV | 30 keV |
| V6 | 1-30 keV | 4.4 keV | 10 keV |
| V7 | 1-10 keV | 5 keV | 5 keV |
| V8 | >10-100 keV | 29.95 keV | 29.95 keV |

The device may comprise the control lens array 250 as described above. The control lens array 250 may be configured to decelerate the charged particle sub-beams along the sub-beam paths. This may be done by controlling potentials of electrodes within the control lens array 250. A main reason to use the control lens to decelerate the charged particle sub-beams is that this improves the performance of the objective lens array 241. The objective lens array comprises a positive elementary lens and a negative elementary lens which partly cancel out each other, but the aberrations add up. Generally, the larger the difference in beam energy between the two electrodes, the lower the aberration coefficients are.

The charge particle-optical device of the present disclosure may comprise the electric power source 290 configured to apply respective potentials to at least one electrodes of the control lenses of the control lens array 250 and/or the objective lenses of the objective lens array 241 in use. More specifically, the electric power source may be configured to provide a potential to the first electrode 242 and/or the second electrode 243. The electric power source 290 may be configured to apply any potential to any other additional electrodes provided as part of the array of objective lenses, including the third electrode 244 described above if present. The electric power source may additionally or alternatively be configured to apply a potential to the sample 208 in use. The electric power source may additionally or alternatively be configured to apply a potential to the detector array 240 in use. The electric power source may comprise multiple electric power sources which are each configured to provide potentials to any of the above-described components.

Figure 7:
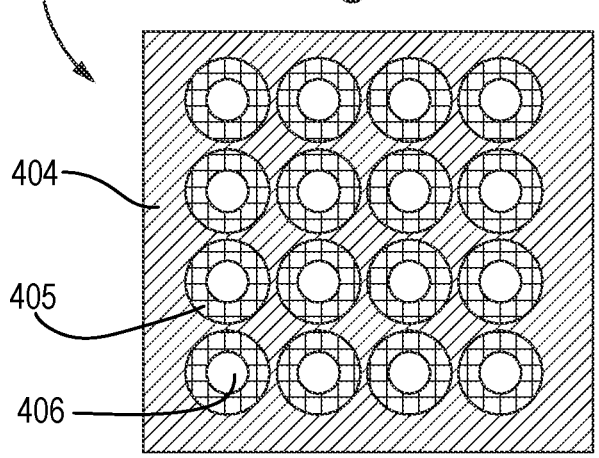
FIG. 7 is bottom view of the objective lens of FIG. 5 or FIG. 6, according to some embodiments of the present disclosure.
Figure 8:
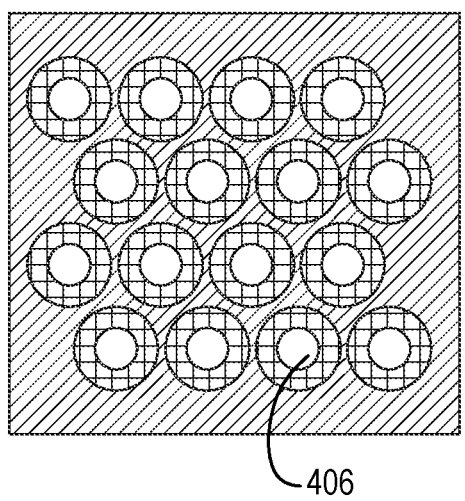
FIG. 8 is a bottom view of a modification of the objective lens of FIG. 5 or FIG. 6, according to some embodiments of the present disclosure.

FIG. 7 is a bottom view of the detector array 240 which comprises a substrate 404 on which are provided a plurality of detector elements 405 each surrounding a beam aperture (or aperture) 406. The beam apertures 406 may be formed by etching through the substrate 404. In the arrangement shown in FIG. 7, the beam apertures 406 are shown in a rectangular array. The beam apertures 406 can also be differently arranged, e.g. in a hexagonal close packed array as depicted in FIG. 8. The beam arrangement of the hexagonal arrangement in FIG. 8 may be more densely packed than the square beam arrangement as shown in FIG. 7. As depicted, the detector elements 405 may be arranged in rectangular array or a hexagonal array.

Figure 9:
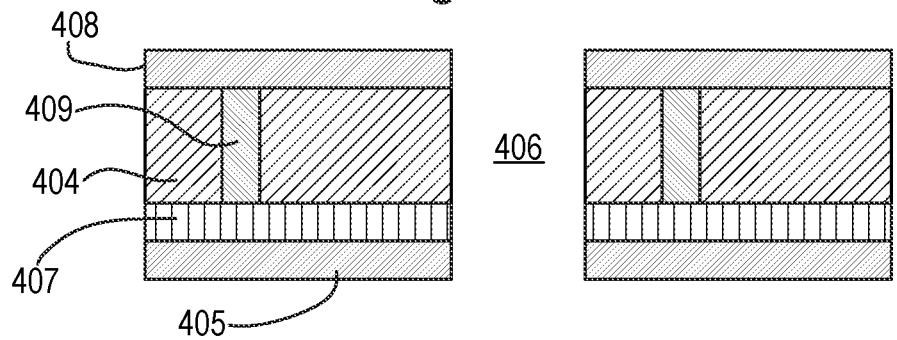
FIG. 9 is an enlarged schematic cross-sectional view of a detector incorporated in the objective lens of FIG. 5 or FIG. 6, according to some embodiments of the present disclosure.

FIG. 9 depicts at a larger scale a part of the detector array 240 in cross section. The detector elements 405 form the bottommost, i.e. most close to the sample 208, surface of the detector array 240. Between the detector elements 405 and the main body of the substrate 404 a logic layer 407 may be provided. At least part of the signal processing system may be incorporated into the logic layer 407.

A wiring layer 408 is provided on the backside of, or within, the substrate 404 and connected to the logic layer 407 by through-substrate vias 409. The number of through-substrate vias 409 need not be the same as the number of beam apertures 406. In particular if the electrode signals are digitized in the logic layer 407 only a small number of through-silicon vias may be required to provide a data bus. The wiring layer 408 can include control lines, data lines and power lines. It will be noted that in spite of the beam apertures 406 there is ample space for all necessary connections. The detection module 402 can also be fabricated using bipolar or other manufacturing techniques. A printed circuit board and/or other semiconductor chips may be provided on the backside of detector array 240.

The integrated detector array described above is particularly advantageous when used with a tool having tunable landing energy as secondary electron capture can be optimized for a range of landing energies.

The detector array 240 may be implemented by integrating a CMOS chip detector into a bottom electrode of the objective lens array. Integration of a detector array 240 into the objective lens array 241 or other component of the charged particle-optical device allows for the detection of charged particles emitted in relation to multiple respective sub-beams. The CMOS chip is preferably orientated to face the sample (because of the small distance (e.g. 50 μm or less, 40 μm or less, 30 μm or less, 20 μm or less, or 10 μm) between the sample and a bottom of the charged particle-optical device and/or electron-optical system). In some embodiments, detector elements 405 to capture the secondary charged particles are formed in the surface metal layer of the CMOS device. The detector elements 405 can be formed in other layers. Power and control signals of the CMOS may be connected to the CMOS by through-silicon vias. For robustness, preferably a passive silicon substrate with holes shields the CMOS chip from high E-fields.

In order to maximize the detection efficiency it is desirable to make the surface of the detector elements 405 as large as possible, so that substantially all the area of the objective lens array 240 (excepting the apertures) is occupied by detector elements 405. Additionally or alternatively, each detector element 405 has a diameter substantially equal to the array pitch (i.e. the aperture array pitch described above in relation to the electrodes of the objective lens assembly 241). Therefore, the diameter of each detector element may be less than approximately 600 μm, and preferably between approximately 50 μm and 500 μm. As described above, the pitch may be selected depending on the intended distance L between the sample and the detector array 240. In some embodiments, the outer shape of the detector element 405 is a circle, but this can be made a square to maximize the detection area. Also the diameter of the through-substrate via 409 can be minimized. A typical size of the electron beam is in the order of 5 to 15 micron.

In some embodiments, a single detector element 405 surrounds each beam aperture 406. In some embodiments, a plurality of detector elements 405 are provided around each beam aperture 406. The electrons captured by the detector elements 405 surrounding one beam aperture 406 may be combined into a single signal or used to generate independent signals. The detector elements 405 may be divided radially. The detector elements 405 may form a plurality of concentric annuluses or rings. The detector elements 405 may be divided angularly. The detector elements 405 may form a plurality of sector-like pieces or segments. The segments may be of similar angular size and/or similar area. The electrode elements may be separated both radially and angularly or in any other convenient manner.

However a larger surface for the detector elements 405 leads to a larger parasitic capacitance, so a lower bandwidth. For this reason it may be desirable to limit the outer diameter of the detector elements 405. Especially in case a larger detector element 405 gives only a slightly larger detection efficiency, but a significantly larger capacitance. A circular (annular) detector element 405 may provide a good compromise between collection efficiency and parasitic capacitance.

A larger outer diameter of the detector element 405 may also lead to a larger crosstalk (sensitivity to the signal of a neighboring hole). This can also be a reason to make the outer diameter of the detector element 405 smaller. Especially in case a larger detector element 405 gives only a slightly larger detection efficiency, but a significantly larger crosstalk.

The charged particle current collected by detector element 405 is amplified, for example by an amplifier such as a TIA.

The detector used in the detector array of the charged particle-optical device may optionally be the detector described below in relation to FIG. 10, FIG. 11, and FIG. 12.

The charged particle-optical device may comprise the control lens array 250 as described above. As described, the control lens array can be positioned up-beam of the objective lens array 241 and each control lens can be associated with a respective objective lens 234. The charged particle optical device may be configured to form an intermediate focus between the control lens array 250 and the objective lens array 241. More specifically, the control lens array 230 may be configured to provide an intermediate focus between respective control lenses and corresponding objective lenses. As described above, the electron-optical device may be configured to control the objective lens assembly (e.g. by controlling potentials applied to electrodes of the control lens array 250) to control a focal length of the control lenses to form the intermediate foci between the control lens array 250 and objective lens array 241.

As mentioned previously, the provision of a control lens array 250 in addition to an objective lens array 241 provides additional degrees of freedom for controlling properties of the sub-beams. The additional freedom is provided even when the control lens array 250 and objective lens array 241 are provided relatively close together, for example such that no intermediate focus is formed between the control lens array 250 and the objective lens array 241. The control lens array 250 may be used to optimize a beam opening angle with respect to the demagnification of the beam and/or to control the beam energy delivered to the objective lens array 241. The control lens may comprise 2 or 3 or more electrodes. If there are two electrodes then the demagnification and landing energy are controlled together. If there are three or more electrodes the demagnification and landing energy can be controlled independently. The control lenses may thus be configured to adjust the demagnification and/or beam opening angle of respective sub-beams (e.g. using the electric power source to apply suitable respective potentials to the electrodes of the control lenses and the objective lenses). This optimization can be achieved without having an excessively negative impact on the number of objective lenses and without excessively deteriorating aberrations of the objective lenses (e.g. without increasing the strength of the objective lenses).

The control lens array 250 can be used to deliver a low beam energy to objective lens array 241. This may be similar to the potential applied to the first electrode of the objective lens array 241 as discussed above, i.e. between approximately +3 kV to +8 kV, or preferably approximately +5 kV. The lower the entrance beam energy of the objective lenses, the shorter the focal length of the objective lenses. Therefore, as described above, an incoming beam energy below 5 kV typically leads to a focus inside the objective lens array 241. Generally, to provide the charged particle beam at the relevant energy into the objective lens array 241, the control lens array 250 is used to decelerate the charged particle beam, e.g. from approximately +30 kV to +5 kV. This will generate a cross over because of the large beam energy difference.

Preferably, the intermediate focusses 236 (interchangeably referred to as the intermediate foci) between respective control lenses and corresponding objective lenses are in a common plane as depicted in FIG. 3. Thus, preferably, the intermediate focusses 236 are positioned in a plane, and specifically, a plane between the control lens array and the objective lens array. Preferably the plane of the intermediate foci are positioned in a plane which is parallel to the control lens array and/or the objective lens array. Preferably, the intermediate focusses 236 are in an array of intermediate foci.

The charged particle-optical device may comprise an insulating structure, which may otherwise be referred to as a spacer. The insulating structure may be provided in the objective lens array. The insulating structure may be provided to separate, i.e. space apart, adjacent electrodes. The shape of the insulating structure may be selected specifically for the objective lens array and how it is to be used. The insulating structure may be provided to separate any adjacent electrodes provided, such as in the objective lens array 240, the condenser lens array (as depicted in FIG. 3) and/or control lens array 250.

The insulating structure could be provided between any adjacent electrodes in the objective lens array. For example, the insulating structure may be positioned between the first and second electrodes, e.g. if two electrodes are provided (as shown in FIG. 5). For example, the insulating structure may be positioned between a first and third electrode and/or between a second and third electrode if three electrodes are provided (as shown in FIG. 6).

Figure 10:
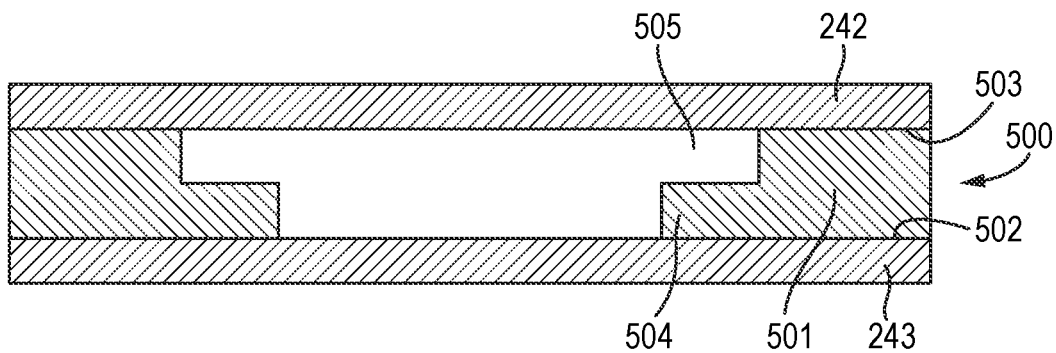
FIG. 10, FIG. 11.
Figure 11:
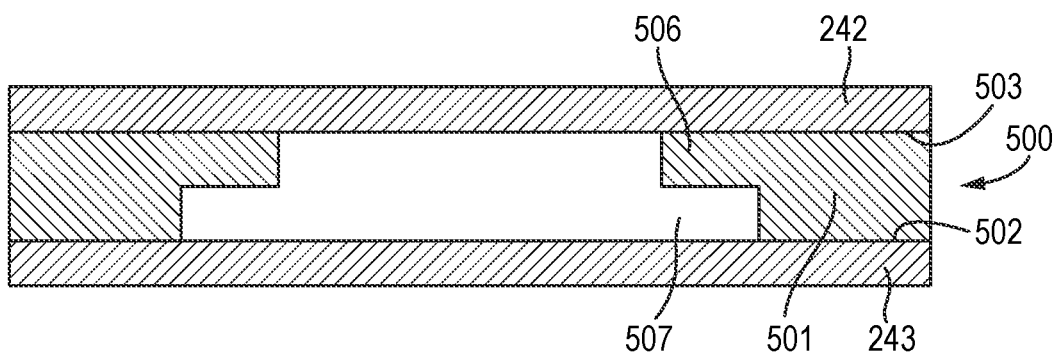
Figure 12:
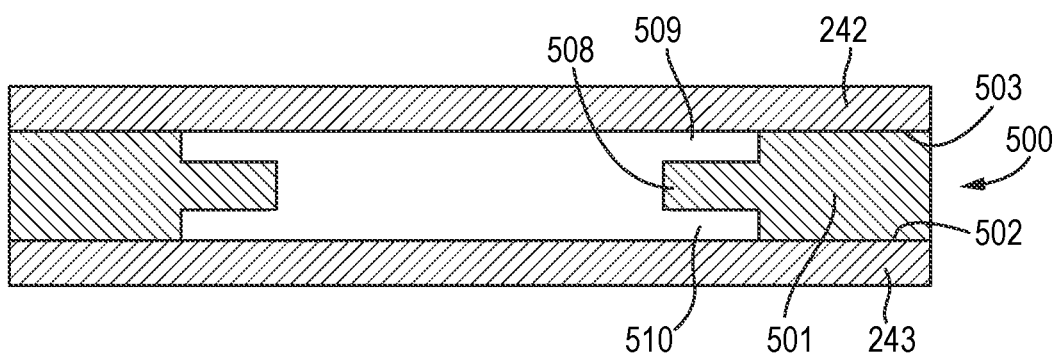
FIG. 12 are schematic cross-sectional views of an insulating structure, according to some embodiments of the present disclosure.

Exemplary shapes of the insulating structure 500 are shown in cross section in FIG. 10, FIG. 11, FIG. 12. The insulating structure 500 may comprise a main body 501 and a protrusion radially inwards of the main body 501. The main body 501 and the protrusion may be integral, i.e. may be formed of one single piece. The protrusion may provide a stepped surface The insulating structure 500, and more particularly the main body, may comprise a first side 502 and a second side 503. The second side 503 may oppose the first side 502. For example, the first side 502 may be a bottom surface of the insulating structure 500 and the second side 503 may be a top surface of the insulating structure 500. The main body may surround the multi-beam path. The main body may be a ring. The inner surface of the ring may provide the protrusion and the stepped surface.

The insulating structure 500 may be configured to optimize the projection of the charged particle beam through array of lenses, such as the objective lens array. Specifically, the shape of the insulating structure 500 may be beneficial in helping the objective lenses withstand the high electrostatic fields, such as in the accelerating direction and to reduce the risk of discharge. The insulating structure may be non-symmetrical when viewed in cross-section, as shown in FIG. 10 and FIG. 11. That is in cross-section the surface of the insulating structure facing the beam path may be stepped. The stepped surface may extend a path length over the surface of the insulating structure. The shortest path length over the stepped surface may exceed a creep length. At or below the creep length for the intended operating potential difference between the electrodes at the first side and second side of the insulating structure there is an elevated risk of discharge between the electrodes. The shape and/or geometry, especially the stepped surface and the protrusion may reduce the fields radially inwards of the insulating structure and the risk of discharge between the electrodes. Specifically, the gap and geometry of the spacer is selected to lower the field at the triple point (vacuum, electrode, spacer) at the more negative of the electrodes either side of the spacer. The use of an insulating structure as shown in FIG. 11 is described in US 2011/0216299, the contents of which are hereby incorporated by reference at least so far as the geometry of the described insulated structure and its function.

In the example in which the charged particles are accelerated towards the sample 208 by the array of objective lenses 241, the insulating structure 500 may be positioned between adjacent electrodes of the objective lens array 241 to optimize acceleration of the charged particles through the objective lens array.

When in place between the adjacent electrodes of the objective lens array, one of the electrodes contacts the main body and the protrusion on the first side of the insulating structure, and the main body contacts another of the electrodes on the second side of the insulating structure and a gap is defined between the protrusion and the other of the electrodes. In other words, the main body and protrusion contacts one of the electrodes, but only the main body contacts the other electrode. Thus, the insulating structure provides a gap between the protrusion and at least one of the electrodes Such an insulating structure 500 is shown in FIG. 11 wherein the first electrode 242 contacts the main body and the protrusion 506 on the first side 503 of the insulating structure 500. The main body 501 contacts the second electrode 243 on the second side of the insulating structure 500. A gap 507 is provided between the protrusion 506 and the second electrode 243 (down-beam of the first electrode 242).

In some embodiments, the objective lens array 241 is an exchangeable module, either on its own or in combination with other elements such as the control lens array and/or detector array. The exchangeable module may be field replaceable, i.e. the module can be swapped for a new module by a field engineer. In some embodiments, multiple exchangeable modules are contained within the tool and can be swapped between operable and non-operable positions without opening the tool.

In some embodiments, the exchangeable module comprises an electron-optical component, and specifically may be the charged particle-optical device, which is on a stage permitting actuation for positioning of the component. In some embodiments, the exchangeable module comprises a stage. In an arrangement the stage and the exchangeable module may be an integral part of the tool 40. In an arrangement the exchangeable module is limited to the stage and the device, such as the charged particle-optical device, it supports. In an arrangement the stage is removable. In an alternative design the exchangeable module comprising the stage is removable. The part of the tool for the exchangeable module is isolatable, that is the part of the tool 40 is defined by a valve up-beam and a valve down-beam of the exchangeable module. The valves can be operated to isolate the environment between the valves from the vacuum up-beam and down-beam of the valves respectively enabling the exchangeable module to be removed from the tool 40 whilst maintaining the vacuum up-beam and down-beam of the part of the tool 40 associated with the exchangeable module. In some embodiments, the exchangeable module comprises a stage. The stage is configured to support a device, such as the charged particle-optical device, relative to the beam path. In some embodiments, the module comprises one or more actuators. The actuators are associated with the stage. The actuators are configured to move the device relative to the beam path. Such actuation may be used to align the device and the beam path with respect to each other.

In some embodiments, the exchangeable module is a microelectromechanical systems (MEMS) module. MEMS are miniaturized mechanical and electromechanical elements that are made using microfabrication techniques. In some embodiments, the exchangeable module is configured to be replaceable within the electron-optical tool 40. In some embodiments, the exchangeable module is configured to be field replaceable. Field replaceable is intended to mean that the module may be removed and replaced with the same or different module while maintaining the vacuum in which the electron-optical tool 40 is located. Only a section of the tool 40 is vented corresponding to the module is vented for the module to be removed and returned or replaced.

The control lens array 250 may be in the same module as an objective lens array 241, i.e. forming an objective lens array assembly or objective lens arrangement, or it may be in a separate module In some embodiments, one or more aberration correctors are provided that reduce one or more aberrations in the sub-beams. The one or more aberration correctors may be provided in any of the embodiments, e.g. as part of the charged particle-optical device, and/or as part of an optical lens array assembly, and/or as part of an assessment tool. In some embodiments, each of at least a subset of the aberration correctors is positioned in, or directly adjacent to, a respective one of the intermediate foci (e.g., in or adjacent to the intermediate image plane). The sub-beams have a smallest cross-sectional area in or near a focal plane such as the intermediate plane. This provides more space for aberration correctors than is available elsewhere, i.e. upbeam or downbeam of the intermediate plane (or than would be available in alternative arrangements that do not have an intermediate image plane).

In some embodiments, aberration correctors positioned in, or directly adjacent to, the intermediate foci (or intermediate image plane) comprise deflectors to correct for the source 201 appearing to be at different positions for different beams. Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses 231 (e.g. with each such aberration corrector being integrated with, or directly adjacent to, one or more of the condenser lenses 231). This is desirable because at or near the condenser lenses 231 aberrations will not yet have led to a shift of corresponding sub-beams because the condenser lenses are vertically close or coincident with the beam apertures. A challenge with positioning correctors at or near the condenser lenses, however, is that the sub-beams each have relatively large sectional areas and relatively small pitch at this location, relative to locations further downstream (or down-beam). The condenser lenses and correctors may be part of the same structure. For example they may be connected to each other, for example with an electrically isolating element The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference.

In some embodiments, each of at least a subset of the aberration correctors is integrated with, or directly adjacent to, one or more of the objective lenses 234. In some embodiments, these aberration correctors reduce one or more of the following: field curvature; focus error; and astigmatism. The objective lenses and/or control lenses and correctors may be part of the same structure. For example they may be connected to each other, for example with an electrically isolating element. Additionally or alternatively, one or more scanning deflectors (not shown) may be integrated with, or directly adjacent to, one or more of the objective lenses 234 for scanning the sub-beams 211, 212, 213 over the sample 208. In some embodiments, the scanning deflectors described in US 2010/0276606, which document is hereby incorporated by reference in its entirety, may be used.

The charged particle-optical device described above may comprise at least the objective lens array 241. Thus, in certain embodiments, the charged particle optical device may be an objective lens array assembly and may have components as described above in relation to the objective lens array assembly.

In some embodiments, for example, the objective lens assembly is for projecting a multi-beam of charged particles towards a sample surface. The objective lens assembly comprises an objective lens array 241 and a detector array 240. The objective lens array 241 may comprise any or all of the features described in relation to the objective lens array 241 above. The detector array 240 may comprise any or all of the features described in relation to the detector array 240 above. The objective lens assembly is configured to detect backscattered charged particles.

The objective lens array 241 comprises at least two electrodes arranged along the path of the multi-beam and in which are defined a plurality of apertures. For example, the objective lens array 241 comprises at least the first electrode 242 and the second electrode 243. The detector array 240 is configured to detect charged particles emanating from the sample in response to the multi-beam. The detector array 240 is positioned down-beam of the objective lens array 241.

The detector array 240 is configured to be positionable proximate to the sample 208 and may have a distance L between the sample 208 and the detector array as described above.

The detector array potential, sample potential, first electrode potential and/or second electrode potential may be set as described above.

In some embodiments, the objective lens assembly may have any or all features of the charged particle-optical device described above. In particular, the objective lens array assembly may comprise a control lens array 250, and/or the scan-deflector array 260.

In some embodiments, for example, a charged particle optical device is provided in which the charged particle optical device is configured to switch between two operation states. The two operation states vary between primarily detecting backscatter charged particles and primarily detecting secondary charged particles. The charged particle optical device, for example, may include any or all of the features described in relation to the above aspects and embodiments. Features that are the same as those described above are given the same reference numerals. For conciseness, such features are not described in detail below.

As described, detection of secondary charged particles and backscatter charged particles are both useful, but different information can be obtained through detection of secondary charged particles and backscatter charged particles. Thus, there is a clear benefit in providing a device which supports detection of both secondary charged particles and backscatter charged particles. Particularly, there is a benefit of providing a device which can easily support switching between detection of secondary charged particles and backscatter charged particles, and vice versa.

As above, the charged particle optical device is suitable for any charged particle system, e.g. a charged particle assessment tool, i.e. assessment tool 40. The device is configured to project an array of beams of charged particles towards a sample; i.e., the device is configured to project a multi-beam of charge particles along sub-beam paths towards a sample 208. The multi-beam comprising sub-beams. The device comprises an objective lens array 241 configured to project an array of charged particle sub-beams onto the sample 208. In other words, the device comprises an objective lens array 241 configured to project the beams onto the sample 208. The device further comprises a detector array configured to capture charged particles emitted from the sample 208. In other words, the device comprises an array of detectors (i.e. detector array 240) configured to detect backscatter particles from the sample. As described above, the detector array 240 may be positioned so to face the sample 208. Preferably, the objective lens array 241 comprises the detector array 240 and/or the detector array 240 is positioned on or adjacent to the objective lens array 241 as described above.

The device is configured to switch between two operation states. In a first operation state, the detectors are configured to detect more secondary charge particles than backscatter charged particles. In other words, in the first operation state, the detectors are configured to detect primarily secondary charged particles. In a second operation state, the detectors are configured to detect more backscatter charge particles than secondary charge particles. In other words, in the second operation state, the detectors are configured to detect primarily backscatter charged particles.

Various different features of the device may be switched between the first operation state and the second operation state. It will be understood that in the first operation state, the device is configured to optimize detection of secondary charge particles and in the second operation state, the device is configured to optimize detection of backscatter charge particles. Thus, in the first operation state, primarily secondary charged particles may be detected. In the second operation state, primarily backscatter charged particles may be detected.

In the second operation state, the device is configured to accelerate the charged particle beam onto the sample 208, and preferably, the objective lenses are configured to accelerate the charged particle beam onto the sample 208. Thus, in the second operation state, the device, and more specifically the objective lens array 241 may operate as described above in order to accelerate the charged particle beam onto the sample 208. In the second operation state, the objective lens array 241 may be configured to repel the secondary charged particles as above.

In the first operation state, the objective lenses are configured to decelerate the charged particle beam onto the sample 208. Multi-beam systems, such as the electron beam tool 40 and charged particle beam inspection apparatus 100 which are operated to decelerate the charged particle beam onto the sample are known and could be used in the first operation state. As discussed, these known systems are useful for detecting secondary charged particles. Thus, the device can be operated in line with such systems when obtaining information from secondary charged particles.

For example, the deceleration may be carried out by selecting which potential are applied to the electrodes of the objective lens array 240. FIG. 4. was described above in relation to the system to show how potentials can be applied to the control lens array 250, the objective lens array 240 and the sample 280. The values of the potentials provided for the accelerating lens might be swapped and adjusted to provide a deceleration.

For example only, the electrons may be decelerated from 30 kV to 2.5 kV in the objective lens. In an example, to obtain landing energies in the range of 1.5 kV to 5 kV, potentials shown in FIG. 4, such as V2, V3, V4, V5, V6 and V7, can be set as indicated in Table 2 below. The potentials in this table are given as values of beam energy in keV, which is equivalent to the electrode potential relative to the cathode of the beam source 201. It will be understood that in designing an electron-optical system there is considerable design freedom as to which point in the system is set to a ground potential and the operation of the system is determined by potential differences rather than absolute potentials.

TABLE 2

| Landing Energy | 1.5 keV | 2.5 keV | 3.5 keV | 5 keV |
|---|---|---|---|---|
| V1 (or omitted) | 29 keV | 30 keV | 31 keV | 30 keV |
| V2 | 1.55 keV | 2.55 keV | 3.55 keV | 5.05 keV |
| V3 | 29 keV | 30 keV | 31 keV | 30 keV |
| V4 | 1.5 keV | 2.5 keV | 3.5 keV | 5 keV |
| V5 | 30 keV | 30 keV | 30 keV | 30 keV |
| V6 | 19.3 keV | 20.1 keV | 20.9 keV | 30 keV |
| V7 | 29 keV | 30 keV | 31 keV | 30 keV |
| V8 | 1.55 keV | 2.55 keV | 3.55 keV | 5.05 keV |

As mentioned above, the objective lens array as shown in FIG. 4 may comprise an additional electrode, e.g. a middle electrode positioned between the upper and lower electrodes of the objective lens array as shown in FIG. 4. A voltage source V1 may be configured to apply a potential to the middle electrode. This middle electrode is optional and may not be included with the electrodes having the other potentials listed in Table 2.

It will be seen that the beam energy at V1, V3 and V7 is the same. In embodiments the beam energy at these points may be between 10 keV and 50 keV. If a lower potential is selected, the electrode spacings may be reduced, especially in the objective lens, to limit reduction of the electric fields.

Although the control lens array 250 and the objective lens array 240 are shown in FIG. 4 with three electrodes, the control lens array 250 and/or the objective lens array 240 may be provided with two lenses.

As described above, the objective lens array comprises at least the first electrode 242 configured to have first electrode potential and the second electrode 243 configured to have the second electrode potential. The first electrode 242 being up-beam of the second electrode 243. An electric power source 290 may be provided for providing potentials as described above. Thus, the electric power source 290 is configured to apply the first electrode potential to the first electrode 242 and the second electrode potential to the second electrode 243. The electric power source 290 is configured to apply a potential as relevant depending on the operation state. Thus, the potential applied to the first electrode and the second electrode may be changed depending on the relevant operation state of the device.

In the first operation state, the first electrode potential may be more positive than the second electrode potential. Additionally or alternatively, in the second operation state, the second electrode potential may be more positive than the first electrode potential. Controlling the potentials and altering them between the first and second operation state can alter how the charged particle beam travels through the objective lens array and thus, will affect whether or not the charged particles are accelerating or decelerating. Varying the electrodes in this way can affect the landing energy of the charged particle sub-beams. Thus, the device may be configured to project the charged-particle sub-beams onto the sample at a lower landing energy in the first operation state and a higher landing energy in the second operation state.

The potentials applied to the first and second electrode may be as described above, and may be swapped around.

Additionally, the sample may be at the sample potential as described above such that the secondary charged particles are repelled from the objective lens array.

Additional or alternative adjustments may also be made when switching between the first operation state and the second operation state.

For example, the device may configured to maintain a focus of the charged-particle sub-beams on the sample in the first and second operation states. More specifically, the objective lens array 241 may be configured to maintain a focus of the charged-particle sub-beams on the sample in the first and second operation states. For example, when switching between the first operation state and the second operation state and vice-versa, the first electrode potential (i.e. the potential of the upper electrode) of the objective lens array 241 may be adjusted to maintain the focus of the primary beam on the sample 208 in the first and second operation states. If the first electrode potential is adjusted to maintain the focus of the charged-particle sub-beams on the sample 208, the distance between the objective lens array 241 and the sample 208 may be maintained.

For example, when switching between the first operation state and the second operation state and vice-versa, the device may be configured to alter a distance between the objective lens array 241 and sample 208. The distance between the objective lens array 241 and sample 208 may be adjusted to account for a difference in the landing energy between the first operation state and the second operation state. The distance may be changed by the order of a few millimeters, or less than a millimeter, or by the order of a few hundred microns, or less.

For example, the device may be configured to reduce a distance between the objective lens array 241 and the sample 208 so as to switch from a first operation state to a second operation state. Additionally or alternatively, the device may be configured to increase a distance between the objective lens array 241 and the sample 208 so as to switch from a second operation state to the first operation state.

Preferably, the distance between the detector array 240 and sample 208 is beneficially maintained in the above examples, i.e. when the first electrode potential and/or the distance between the objective lens array 241 and the sample 208 are changed. The detector array 240 may be moved relative to the objective lens array 241 to maintain the distance between the detector array 240 and the sample 208. The movement of the detector array 240 may be made either whilst the objective lens array 241 is moved relative to the sample 208 or whilst altering the position of the sample relative to the objective lens array 241 along the beam path (i.e. then the detector array 240 tracks the sample along the beam path.

Alternatively, it may be beneficial to alter the distance between the detector array 240 and the sample 208 to focus charged particles emitted from the sample 208 onto the detector array 240. In particular, the distance between the detector array 240 and the sample 208 may be altered between the first operation state and the second operation state so that the secondary charged particles are focused on the detector array 240 when in the first operation state and the backscattered charged particles are focused on the detector array 240 when in the second operation state.

If the detector array 240 is to be moved relative to the sample 208, this could be done by controlling the position of the detector array 240 relative to the objective lens array 241 or by controlling the position of the detector array 240 relative to the sample 208. Any appropriate actuator could be used to move the detector array 240, i.e. relative to the objective lens array 241 and/or relative to the sample 208.

One way that the device may switch between the first and second operation states involves providing a charged particle-optical device which comprises, or is provided in the form of, a switchable module. The switchable module may comprise an objective lens array and a detector array, and optionally a control lens array. Thus, the switchable module may be a switchable objective lens array assembly A switchable module may be provided for each operating state. Thus, different insulating structures may be provided for different switchable modules depending on which operating state it is to be used for. The switchable module may provide the objective lens array 241 at a different position so that the objective lens array is provided in a different position with respect to the sample 208. In other words, different switchable modules may have the detector array at different distances from the sample along the sub-beam path 220. The detectors used in the detector arrays may be different for different switchable modules depending on which operating state it is to be used for. The detector array 240 in the different modules may be kept at the same distance with respect to the sample 208, or the distance between the detector and the sample might be different between modules to account for the charged particles emitted from the sample 208 and can be detected by the detector array 241.

In the device, insulating structures may be provided between adjacent electrodes as described above. The insulating structures may be different depending on which operation state is preferable. For example, for a second operation state, the insulating structure may be as described in relation to FIG. 11. For a first operation state, the insulating structure may be provided as shown in FIG. 10. This is similar to the insulating structure of FIG. 11, expect that the gap 505 is provided between the up-beam electrode (i.e. the first electrode 242) and the radially inwards protrusion 504. This insulating structure may be particularly beneficial for optimizing passage of the charged particle beam through the objective lens array 241 when the beam is being decelerated for example for the reasons set out here. In the arrangement shown in FIG. 11 the first electrode 242 has a potential less positive than the second electrode 243. In the arrangement the protrusion is in contact with the first electrode 242. Whereas in the arrangement of FIG. 10, the first electrode 242 has a potential more positive than the second electrode 243, so the direction of the potential difference between the electrodes is different, i.e. opposing, to the arrangement depicted in FIG. 11. That is why in this example the protrusion is in contact with the second electrode 243. By selecting the location of the protrusion, i.e. in contact with the first or second electrode, the risk of undesired discharge may be reduced.

The switchable modules may be controlled and adapted as described above.

Another way that the device may switch between the first and second operation states involves providing a charged particle-optical device which can be adjusted to operate in both operation states, i.e. a hybrid charged particle-optical device (referred to as a hybrid device) which can be used in both the first operation state and the second operation state. In this instance, the distance between the objective lens array 241 and the sample 208 may be adapted when switching states. In this instance, the potentials applied to the electrodes may be adapted when switching states. In this instance, an insulating structure may be provided which is suitable for both operation states. In this instance, an array of detectors which are suitable for both modes of operation may be provided (as described below).

In the hybrid device, adjacent electrodes are separated by an insulating structure which is configured for use in the first operation and the second operation, preferably wherein the objective lens array comprises the insulating structure. Such an insulating structure may be provided as shown in FIG. 12, and may be referred to as a hybrid insulating structure. The hybrid insulating structure is similar to the insulating structures shown in FIG. 10 and FIG. 11, expect that a gap 509, 510 is provided on either side of the radially inward protrusion 508. Thus, the electrodes either side of the hybrid insulating structure are in contact with the main body 501. However, the radially inward projection 508 does not contact either of the first electrode 242 or the second electrode 243.

In further detail, the insulating structure 500 is formed of the main body 501 and the protrusion 508 radially inwards of the main body 501. The main body 501 features a first and second side, the first side 503 opposing the second side 502. On the first side 503 of the insulating structure the main body 501 contacts one of the electrodes (e.g. the first electrode 242) and a first gap 509 is formed between the protrusion 508 and the one of the electrodes 242. On the second side 502 of the insulating structure, the main body 501 contacts another one of the electrodes (e.g., the second electrode 243) and a second gap is formed between the protrusion 508 and the other of the electrodes (e.g., the second electrode 243).

The hybrid device may be configured to move the objective lens array and/or the sample with respect to each other along the sub-beam paths 220 so as to switch between the first and second operation states. For example, the device may comprise an actuator 248 configured to move the objective lens array so as to alter the distance between the objective lens array and the sample. The actuator 248 may be part of the objective lens array assembly. Disclosure of a device featuring an actuator to displace the detector along the multi-beam path is European Patent Application 20198201.4 filed on 24 Sep. 2020 which is hereby incorporated by reference with respect to the design and use of an actuator to actuate a detector array relative to an objective lens array.

Additionally or alternatively, the hybrid device is configured to move the sample so as to alter the distance between the objective lens array 241 and the sample 208. For example, the device may comprise the motorized stage 209 (and optionally the sample holder 207) which can be used to alter the position of the sample.

As described above, the device may switch between different operation states or modes. In any of the above examples, the switching between operation states may be used to detect different types of charged particles in different operation states. For example, the device may operate in the first operation state to detect more of one type of signal particle (e.g. secondary charged particles), and then in the second operation state to detect more of a different type of signal particle (e.g. backscatter charged particles). The device may be configured to operate in the first or second operation state for a given period of time, depending on which particles are of more interest. The device may be configured to switch between any number of additional states or modes As previously described, different information relating to the sample 208 may be obtained by measuring different types of charged particles. For example, measurement of secondary charged particles may be used to obtain information about the top surface, e.g. for imaging the top surface, and backscatter charged particles may be used to obtain data about features under the surface of the sample, e.g. for imaging under the surface. Obtaining data from the different types of charged particle may be used to compare the surface of the sample and features under the surface of the sample. This may be beneficial, for example, in identifying information relating to features already defined in the sample which can be used to determine the positioning of features in different layers of the sample. Such data relating to different layers could be used, for example, to identify an overlay error by using signal electrons (e.g. different types of signal electrons) for features in different layers at overlapping positions. Thus, switching of the device between different operational states may be used as described above to detect different types of signal particles which can be particularly useful for such overlay measurements. Generally, when switching modes, the electrostatic field between the sample and detector is reversed such that in one mode the secondary signal particles are repelled from the detector array 241; in the other mode the secondary charged particles are accelerated towards the detector array 241. In the above described embodiments, the landing energy is generally changed between the different operation states. For example, the landing energy may be approximately 2.5 kV in the first operation state (when more secondary charged particles are detected than backscatter charged particles), and the landing energy may be greater than or equal to approximately 30 kV in the second operation state. However, whilst switching between different modes (i.e. operation states), there is a risk of system drift (i.e. a movement in sample position or beam position), which can result in an overlay measurement error.

In some embodiments, for example, the device may be configured to switch between the first operation state and the second operation state continuously, i.e., to allow ongoing, or near-ongoing, detection of the secondary charged particles and the backscatter charged particles, as described below. In other words, the detection may switch back and forth between the operation states to allow detection of backscatter charged particles then secondary charged particles and vice versa. The operation of the device interleaves detection of the signal particles preferred by the different operating modes.

Preferably the switching occurs rapidly, as will be described in further detail below. Generally, the continuous switching between the first and second operation state may provide substantially, or at least nearly, simultaneous detection of backscatter charged particles and secondary charged particles. The switching may be controlled by a controller, described below.

The switching comprises the device switching between a first potential and a second potential. In other words, the device may turn on and off a repulsion potential so that when the repulsion is on, the detector array 240 is configured to repel secondary charged particles. Generally, it is the detector array 240 which is provided with the repulsion potential to repel the secondary charged particles, as the detector array 240 tends to be closer to the sample 208 than the objective lens array 240. However, the repulsion potential could be supplied to the objective lens array 240 as well, or instead of, supplying the repulsion potential to the detector array 241.

As the secondary charged particles tend to have low energy (for example, compared to the backscattered charged particles), they can be effectively repelled by a relatively low repulsion potential. This is beneficial in that the repulsion potential can be quickly turned on and off.

For example only, in an arrangement, a potential of +5 V may be applied to the detector array 240 for acceleration and a potential of −25 V may be applied to the detector array 240 for repulsion. The potential may be applied to at least a part of the objective lens array 241 as well, or instead of, the detector array 240. There may still be some secondary charged particles detected during the backscatter charged particle mode and vice versa. However, in the first operation state (when the detector detects more secondary charged particles than backscatter charged particles), the proportion of backscatter charged particles may be approximately 20%. Additionally or alternatively, in the second operation state (when the detector detects more backscatter charged particles than backscatter charged particles), the proportion of secondary charged particles may be approximately 35%.

Generally, the voltage difference between the first operation state and the second operation state may be 10s of volts, e.g. 30 V as described above. Having a voltage difference of this magnitude is beneficial in that switching can be done very fast, e.g. on the millisecond scale, so switching can be done many times during acquisition of data (e.g. from which images can be rendered). Additionally, this is beneficial because the effect of the voltage change has negligible effect on the primary sub-beams.

The device may comprise a controller which is configured to control the switching between the operation states. For example, the controller may be configured to control the repulsion potential being applied to the detector array 240 and/or the objective lens array 241. The controller may the same as the controller 50 described above.

The landing energy in the first operation state and the second operation state may be substantially the same and/or is substantially maintained. In other words, the landing energy may be substantially constant with fast switching between the first and second operation states. In particular, a signal can be generated from the secondary charged particle detection and a signal can be generated from the backscatter charged particle detection when the same landing energy is used. Generally, backscatter charged particles need higher landing energy than secondary charged particles in order to obtain sufficient signal. Therefore, the landing energy is preferably high enough to provide a backscatter charged particle signal. For example, in an arrangement, the landing energy may be greater than or equal to 10 kV, between approximately 10-15 kV, greater than or equal to approximately 15 kV, or greater than or equal to approximately 30 kV. At such landing energies, a useful secondary charged particle signal can be generated as well. When the landing energy is kept substantially constant, the only voltage change may be in relation to the repulsion potential.

Preferably, the rate at which device switches between the first operation state and the second operation state or vice versa is between approximately 10 ms to 1 s, or preferably, between approximately 10 ms to 100 ms, or preferably between approximately 20 ms and 50 ms. As described above, the device may drift between measurements. Therefore if the device switches between the first operation mode and the second operation mode and vice versa fast enough, then this can reduce or avoid the impact of drift. This will depend on how much drift there is and how quickly the device switches between the modes. Generally, the drift tends to be small at the millisecond scale, so the switching being every 10 ms or so should be fast enough to avoid drift. At this switching rate the device may operate in the two different operation modes over the same portion of sample surface within 50 ms, or 30 ms, or approximately 20 ms. Thus the continuous switching between the first and second operation state may provide substantially, or at least nearly, simultaneous detection of backscatter charged particles and secondary charged particles. It will be noted that the potential can be switched at this timescale. Preferably the device switches between the first operation state and the second operation state or vice versa at least once every few seconds, or at least once every second, or at least once every 100 ms, or at least once every 10 ms. A shorter time scale avoids significant repositioning of the beam path and the sample relative to each other so that the device can operate on the same portion of the sample in both modes. More generally, the faster the rate of switching between the operation states the better for accounting for drift. However, faster switching between operation states may be more difficult regarding the overhead time needed for switching between the operation states which reduces throughput. Thus, the rate may be selected, preferably based on the above ranges and values, to optimizing loss of accuracy as a result of drift versus loss of throughput because of overhead time.

It will be noted that obtaining data when operating the device in a mode to detect backscatter signal particles, for example for making a backscatter image, may take longer than obtaining data when operating the device in mode to detect secondary signal particles, for example for making an image using secondary charged particles. Therefore, the device might switch every 10 ms to 100 ms to for a device to process a portion of the surface for detecting the backscatter charged particles. Obtaining detection data of secondary charged particles of the same portion of the sample surface may be approximately ten (10) times faster. In one arrangement the device may operate on the same surface portion in different operational modes sequentially. In another arrangement, the device may be used over sequential portions of the sample surface in different modes to generate partial data sets. For example the device may be used to scan one section in a first operation mode, and then scan the next section in a second operation mode. Only partial images may be scanned in one mode before switching.

The present example might have higher backscatter charged particle detection efficiency than other modes of detection (e.g., simultaneous detection described below), which is advantageous for throughput. The reasons for this are described below.

As described above, for example, it may be beneficial to provide a device that can switch between detection of secondary charged particles and backscatter charged particles. In some embodiments, a detector can be provided and can operate in two operating states. The detector can be provided as part of the charged particle optical device of the any of the previous aspects and embodiments and may include any or all of the features described in relation to the detector and/or detector arrays of the above aspects and embodiments. Features that are the same as those described above are given the same reference numerals. For conciseness, such features are not described in detail below.

In some embodiments, a detector is provided for a charged particle assessment tool, wherein the detector is configured to capture charged particles emitted from a sample. In other words, the detector is configured to detect charged particles emitted from the sample.

The detector is configured to switch between two operation states. In a first operation state, the at least one detector is configured to detect more secondary charged particles than backscatter charged particles, and in a second operation state, the at least one detector is configured to detect more backscattered charged particles than secondary charged particles.

The detector is configured to switch between two operation states. The detector may comprise an inner detecting portion surrounding the aperture and an outer detecting portion, radially outwards of the inner detecting portion (as shown and described in relation to FIG. 13A). The detecting portions are described in further detail below. The two states may use a different configuration of the detector (i.e. a different configuration of detecting portions).

The difference in energy between the secondary charged particles and the backscattered charged particles results in the charged particles being affected different amounts by the potentials discussed above. Backscattered charged particles may be more likely to be detected over the whole area of the detector. However, secondary charged particles tend to be detected more towards the middle of the detector. As described in further detail below, this is because the secondary charged particle generally have small average energies (i.e. less than the backscattered charged particles and typically close to 0V). Thus, the trajectories of the secondary charged particles are more significantly changed (i.e. collimated) by the field, for example compared to backscatter charged particles which, on average, have larger energies. The more the secondary charged particles are accelerated, the more their angle becomes parallel to the optical axis (i.e. the sub-beam paths). As a result, the secondary charged particles do not spread out that much, i.e. the trajectory of secondary charged particles tends to be more collimated with the sub-beam path than the trajectory of backscatter charged particles. It is beneficial to provide a detector which can support detection of secondary charged particles and backscatter charged particles separately from each other. In particular, as the charged particles can be used to determine different information, it is beneficial to control the detection to detect either secondary charged particles or backscatter charged particles.

Thus, the detector can be particularly useful in that it can allow switching between two different detection states. Thus, the detector is configured to be operated to detect primarily backscattered charged particles in one state and to detect primarily secondary charged particles in another state. As described in further detail below, the detector is divided radially (i.e. to form a plurality of concentric annuluses).

Although the detector is described above in the context of switching between two operation states, the detector may be more generally provided as described here. The detector as described here may be used for continuous or substantially continuous detection.

In some embodiments, a detector for a charged particle assessment tool is provided; the detector comprises multiple portions. Thus, the detector may be provided with multiple portions and more specifically, multiple detecting portions. The different portions may be referred to as different zones. Thus the detector may be described to have multiple zones or detection zones. Such a detector may be referred to as a zoned detector.

The zoned detector may be associated with one of the sub-beams 211, 212, 213. Thus, the multiple portions of one detector may be configured to detect signal particles emitted from the sample 208 in relation to one of the sub-beams 211, 212, 213. The detector comprising multiple portions may be associated with one of the apertures in at least one of the electrodes of the objective lens assembly. More specifically, the detector 405 comprising multiple portions may be arranged around a single aperture 406 as shown in FIG. 13A and FIG. 13B, which provide examples of such a detector.

The portions of the zoned detector may be separated in a variety of different ways, e.g. radially, annular, or any other appropriate way. Preferably the portions are substantially the same size and/or shape. The separated portions may be provided as a plurality of segments, a plurality of annular portions (e.g. a plurality of concentric annuli), a plurality of sector portions (i.e. radial portions or sectors). For example, the at least one detector 405 may be provided as annular portions comprising 2, 3, 4, or more portions. More specifically, as shown in FIG. 13A, the detector 405 may comprise an inner annular portion 405A surrounding aperture 406 and an outer annular portion 405B, radially outwards of the inner annular portion 405A. Alternatively, the detector may be provided as sector portions comprising 2, 3, 4, or more portions. If the detector is provided as two sectors, each sector portion may be a semi-circle. If the detector is provided as four sectors, each sector portion may be a quadrant. This is shown in FIG. 13B in which the 405 is divided into quadrants, i.e. four sector portions is shown in FIG. 13B, as described below. Alternatively, the detector may be provided with at least one segment portion.

Each portion may have a separate signal read-out. The detector being separated into portions, e.g. annular portions or sector portions, is beneficial in that it allows more information to be obtained in relation to the signal particles detected. Thus, providing the detector 405 with multiple portions may be beneficial in obtaining additional information relating to the detected signal particles. This can be used to improve the signal to noise ratio of the detected signal particles. However, there is an additional cost in terms of the complexity of the detector.

In an example, the detector may be divided into two (or more) concentric rings, for example as depicted in FIG. 13A.

As shown in FIG. 13A, the detector, in which an aperture 406 is defined and configured for the through passage of a charged particle beam, comprises an inner detecting portion 405A and an outer detecting portion 405B. The inner detecting portion 405A surrounds the aperture 406 of the detector. The outer detecting portion 405B is radially outwards of the inner detecting portion 405A. The shape of the detector may be generally circular. Thus, the inner detecting portion and the outer detecting portion may be concentric rings. Such a detector may be used for a configuration in which detection switches between different operation states or modes (e.g. as described above) and/or a simultaneous detection configuration (e.g. as described below).

Even without switching the operation state of the detector, providing multiple portions concentrically or otherwise may be beneficial. Specifically, different portions of the detector may be used to detect different signal particles, which may be smaller angle signal particles and/or larger angle signal particles, or secondary charged particles and/or backscatter charged particles. Such a configuration of different signal particles may suit a concentrically zoned detector.

In this case, signal particles with smaller angles (e.g. small angle backscatter charged particles) may contribute mostly to the inner annular portion 405A and signal particles with larger angles (e.g. large angle backscatter charged particles) may contribute mostly to the outer annular portion 405B. In other words, the inner ring may be used for detection of small-angle backscatter charged particles and the outer ring may be used for detection of large-angle backscatter charged particles. As the portions of the detector may result in separate signals, this means that the detection of small and large angle charged particles can be detected separately. The different angled backscattered charged particles may be beneficial in providing different information. For example, for signal electrons emitted from a deep hole, small-angle backscattered charged particles are likely to come more from the hole bottom, and large-angle backscattered charged particles are likely to come more from the surface and material around the hole. In an alternative example, small-angle backscattered charged particles are likely to come more from deeper buried features, and large-angle backscattered charged particles are likely to come more from the sample surface or material above buried features.

The width (e.g. diameter) of the first detecting portion may be approximately 2 µm to 100 µm. The width (e.g. diameter) of the first detecting portion may be less than or equal to approximately 100 µm. The width (e.g. diameter) of the first detecting portion may be greater than or equal to approximately 2 µm. The width (e.g. diameter) of the second detecting portion may be less than or equal to approximately 250 µm. The width (e.g. diameter) of the second detecting portion may be less than or equal to approximately 150 µm. The width (e.g. diameter) of the second detecting portion may be greater than or equal to approximately to 10 µm. The width (e.g. diameter) of the second detecting portion may be approximately 10 µm to 250 µm. Preferably, the width of the second detecting portion may be approximately 10 µm to 150 µm. The size of the corresponding portions, e.g. the width/diameter of the inner annular portion 405A and/or the outer annular portion 405B may be designed or selected in order to detect the particular charged particles of interest at each of the portions of the detector.

For the switching configuration of the device with concentrically zoned detectors in which the zones are used alternately, as depicted in FIG. 13A, the diameter of the first detecting portion in such an arrangement is preferably approximately 40-60 µm, and preferably approximately 30-50 µm. The diameter of the second detecting portion in such an arrangement is preferably approximately 150 to 250 µm, and preferably approximately 200 µm. The diameter of the aperture of the detector in such an arrangement may be approximately 5 to 30 µm, and preferably approximately 10 µm.

In the first operation state, the detector 406 uses the inner detecting portion 405A and not the outer detecting portion 405B. This is beneficial as it limits the detection of backscatter charged particles during detection of the secondary charged particles. As most of the secondary charged particles would be detected by the inner detecting portion, this does not result in a too much information being lost from undetected secondary charged particles.

In the second operation state, the detector 406 uses at least the outer detecting portion 405B. When the backscatter charged particles are being detected, the device as described above may be set up so as to repel secondary charged particles, which can reduce the number of secondary charged particles detected. Therefore, as other mechanisms may be put into place to reduce or avoid detection of secondary electrons when detecting backscatter charged particles, the whole detector available can be used for detecting backscatter charged particles which is beneficial in capturing information relating to more of the backscattered charged particles.

The distance at which the detector is provided relative to a sample 208 and/or the pitch p may affect which of the outer detecting portion and/or the inner detecting portion might be used for detecting backscattered charged particles and/or secondary charged particles. For example, it is generally described above that in the inner detecting portion is used for detecting secondary charged particles and the outer detecting portion (and optionally also the inner detecting portion) are used for detecting backscattered charged particles. This may be the case, for example only, when the detector is provided approximately 50 microns from the sample with a pitch of approximately 300 microns. However, if the distance between the detector and the sample is approximately 10 microns and the pitch p is approximately 70 microns, the detector may only be used to detect backscattered charged particles (as secondary charged particles will likely end up in the aperture) and the inner detecting portion may be used for detecting backscattered charged particles. Either way, it is understood that the separated inner and outer portions can be used to beneficially switch between detecting primarily backscattered charged particles and/or primarily secondary charged particles.

Multiple detectors may be provided. The multiple detectors may be provided as a detector array, as shown in FIG. 14. The detector array is for a charged particle assessment tool configured to operate in a backscatter operational state (i.e. the second state) to detect preferably backscatter charged particles, and a secondary charged particle state (i.e. the first state) to detect preferably secondary charged particles. The detectors of the detector array may be as described with any of the variations that switch between states.

The detector may have features as described in relation to the detector/detector array. For example, although the outer shape of the detector is shown to be a circle, this can be made a square to maximize the detection area. For example, although FIG. 14 depicts the beam apertures 406 in a rectangular array, the beam apertures 406 can also be differently arranged, e.g. in a hexagonal close packed array as depicted in FIG. 8. For example, cross section of FIG. 15 corresponds to the cross-section of FIG. 9, expect for the detecting portion being provided as an inner portion 405A and an outer portion 405B and thus the detector may comprise the same features as described in relation to FIG. 9 above.

As described, the detector, for example, may be used in any of the above aspect and embodiments. In particular, a charged particle-optical device for a for a multi-beam charged particle assessment tool may be provided. The charged particle-optical device comprising an objective lens array and a detector array, the detector array comprising an array of detectors as described above. The apertures in the electrodes of objective lens array and the detector array are arranged on sub-beam paths of the charged particle multi-beam. Furthermore, if the charged particle optical device, for example, is used with the detector, the detector could be used with either variation. However, the detector would be particularly useful for the hybrid device, as the detector could be switched between a first operation state and a second operation state in accordance with the hybrid device. For example, using the objective lens and detector, the device may be configured to use the detector in the appropriate operating state.

It may be beneficial to provide a device which can be used to detect different types of signal particles, for example both backscatter and secondary charged particles, simultaneously. However, a device used to detect different types of signal particles simultaneously, such as both backscatter charged particles and secondary charged particles, may not effectively discriminate between the different types of signal particles, i.e. in the provided example secondary and backscatter charged particles. This may be the case, for example, if the detector detects without distinguishing between the different types of signal particle, e.g. by detecting the net charge arriving on it (i.e. a charge detector) or if the detector acts as a counter or if the detector is an integrating detector (i.e. a detector summing the energies deposited by the particles that fall on it during a certain time). Resulting detection signals and any corresponding images will be built up from a mix of different signal particles, for example secondary and backscatter charged particles. As the secondary charged particles and back-scattered charged particles may have different detection contrast, e.g. image contrast for example on rendering an image, this means that information relating to the contrast between the secondary and backscatter charged particles may not be detected.

The embodiments described below provide some additional/alternative configurations for simultaneous detection of different signal particles, for example detection of secondary charged particles and backscatter charged particles. These embodiments may be beneficial in improving the detection of different signal particles (e.g. secondary and backscatter charged particles), for example, by more easily distinguishing between the detection signals of different signal particles, e.g. secondary and backscatter charged particles, which may be detected simultaneously. It may be beneficial to provide a detector and/or device which can be used to detect different types of signal particles (e.g. backscatter charged particles and secondary charged particles) without switching as the operation of the device may be simpler. The embodiments described below could be combined with any and all variations, aspects and embodiments described above.

In some embodiments, the device is provided as described in any of the above-described variations, aspects and embodiments. The device comprises an objective lens array as described above. The device comprises a detector array 240 associated with the objective lens array 241. The detector array 240 may be proximate the sample 208. Each detector element comprises at least two detecting portions configured to detect charged particles from the sample. In other words, each detector may comprise two detecting portions (e.g. a first detecting portion and a second detecting portion). Each detector may otherwise be referred to as a detector element 405. The detecting portions are separate from each other. The detecting portions may detect charged particles independently of each other. In other words, each detecting portion may be operated independently of each other.

The different detecting elements 405 may be configured to detect preferentially a different type of signal electron. For example, a detector element may have two or more detecting portions. In an arrangement a detector element has two detecting portions that are configured differently: configured to detect more backscattered charged particles than secondary charged particles; and configured to detect more secondary charged particles than backscattered charged particles. The two detecting portions can be used simultaneously. This may be beneficial in that the landing energy can be kept constant whilst using the detector with at least two detecting portions. The detector elements comprising at least two detecting portions as described above may be provided in combination with any of the above embodiments, aspects and variations.

One of the detecting portions may be an outer detecting portion, and the other detecting portion may be an inner detecting portion. The detecting portions surround an aperture (or beam aperture), for example defined in a detector array, for the passage therethrough of a charged particle beam. An inner detecting portion 405A may be proximate to the aperture; the inner detecting portion is more proximate the aperture than the outer detecting portion. The inner detecting portion 405A is radially inwards of the outer detecting portion 405B. The detector may be configured as described above, for example, as shown in FIG. 13A in which two annular detecting portions are provided; the detector array may be arranged as shown in FIG. 14, or as shown in FIG. 8 with the detector element as depicted in FIG. 13A. Each of the detectors comprises an inner detecting portion 405A configured to detect more secondary charged particles than backscatter charged particles and an outer detecting portion 405B configured to detect more backscattered charged particles than secondary charged particles. Preferably the inner detecting portion 405A and the outer detecting portion 405B shaped as rings-. In this case, the detector may otherwise be referred to as a multiple, for example double, ring detector.

The detector array, such as with the multiple ring detector, can be used to distinguish between different types of signal particles based on their trajectory from the sample. Such an application of the multiple ring detector can be beneficial for distinguishing between secondary charged particles and backscatter charged particles. This application of the detector array makes use of the fact that the angular trajectory of secondary charged particles from a sample tends to cause them to end up at the corresponding detector element within an area of the detector surface much closer to the primary sub-beam than backscatter charged particles.

In particular, application of a field between the sample and the detector (e.g. which is used to decelerate the primary sub-beam) can accelerate secondary and backscatter charged particles. The field operates on the signal particles differently from the primary sub-beam because the signal particles are directed in an opposing direction, relative to the field. The field will generally affect the secondary charged particles more than the backscatter charged particles and will cause the trajectory of the secondary charged particles radially inwards (i.e., towards the path of primary sub-beam). The larger the electric field between sample and detector, the stronger this effect is. This is because, as mentioned elsewhere, the secondary charged particle has a smaller energy on average (i.e., typically close to 0V, e.g., around 50 eV which is substantially 0V relative to potentials in excess of 10 keV). Thus, the trajectories of the secondary charged particles are more significantly changed (i.e. collimated) by the field, for example compared to backscatter charged particles which, on average, have larger energies. The more the secondary charged particles are accelerated, the more their angle becomes parallel to the optical axis (i.e. the sub-beam paths). As a result, the secondary charged particles do not spread out that much, i.e. the trajectory of secondary charged particles tends to be more collimated with the sub-beam path than the trajectory of backscatter charged particles. The trajectory of the secondary charged particles improves in collimation towards the inner detecting portion. However, the path of the backscatter charged particles is barely affected; that is the path of the backscatter charged particles remains relatively uninfluenced by the change in the electric field compared to the path of the secondary charged particles. Thus, secondary charged particles can be detected by an inner detecting portion 405A, or at least preferentially, and backscatter charged particles can be detected by an outer detecting portion 405B (i.e. radially outwards of the inner portion), or at least preferentially. In other words, the separation of secondary charged particles and the backscatter charged particles can be improved over earlier designs of detector. The performance of the detector is improved towards substantially separate detection of different types of signal particle such as secondary charged particles and backscatter charged particles by different detecting portions. Such detection is preferably simultaneous. These improvements in using different detecting positions may be achieved by using the difference in secondary charged particle and backscatter charged particle trajectories relative to the different detecting portions of a detector element.

Each detecting portion may have a separate signal readout. An insulating portion may be provided between the detecting portions to prevent signals passing between the portions. The insulating portion may be any appropriate material which stops signals passing between the detecting portions. The insulating portion is preferably as small as practicable whilst preventing signal passing between the portions. The insulating portion may be approximately 0.5 µm to 2 µm, for example 1 µm.

As the inner detecting portion 405A sits within the outer detecting portion 405B, the outer diameter of the inner detecting portion 405A may be similar to the inner diameter of the outer portion 405B. The parameter that can be optimized is size of the inner detecting portion 405A and the outer detecting portion 405B.

For example only, in an arrangement, it is assumed that a secondary charged particle coefficient is 1 and a backscatter charged particle coefficient is 20%. The secondary charged particle coefficient is the average number of secondary charged particles emitted per incoming primary charged particle (i.e., of the sub-beam) hitting the sample. The backscattered charged particle coefficient is the average number of backscattered charged particles emitted per incoming primary charged particle (i.e., of the sub-beam) hitting the sample. It is assumed that the distance between the sample and the detector is approximately 10 microns, the beam pitch (distance between adjacent sub-beams) is approximately 70 microns, the aperture of the detector has a diameter of approximately 10 microns and the outer diameter of the detector is approximately 50 microns. It is assumed that the potential difference between the sample and the detector array is approximately +27 V (which is the maximum field assumed in HMI tools of 2.7 kV/mm). It was noted that the detection efficiency of the inner detecting portion 405A and the outer detecting portion 405B could be optimized by selecting the diameter of the first detecting portion 405. Generally, it was found that the smaller the inner detecting portion 405A (i.e. the larger the outer detecting portion 405B), the greater the backscatter signal on the outer detecting portion 405B. However, for the detection of the secondary signal particles on the inner detection portion 405A, it was found that the improvement in detection tails off when the inner detecting portion 405A reaches a certain size. The secondary signal detection was found to approach the maximum detection when the diameter of the inner detecting portion 405A was between 20 to 30 microns (and did not improve significantly when the inner detecting portion 405A was increased in size).

In further detail, as described above, the secondary signal particles have a trajectory which is quite close to the sub-beam, which means that some secondary signal particles are likely to pass through the aperture in the detector. There is a minimum aperture in the detector to allow the sub-beam to pass through the detector, meaning that the aperture must be large enough for the sub-beam to pass through (towards the sample) such that a certain proportion of the signal particles will pass through the aperture (travelling away from the sample) and will not be detected. As the trajectories of the secondary charged particles tend to be quite close to the primary beam, increasing the size of the inner detecting portion 405A past a certain diameter is unlikely to result in detection of significantly more secondary signal particles (as the secondary charged particles do not tend to have trajectories which result in them landing further outwards on the detector). Thus, the size of the inner detecting portion can be selected to optimize detection using both portions of the detector, taking into account detection of secondary signal particles on the inner detecting portion 405A and detection of the backscatter signal particles on the outer detecting portion 405B. It will be understood that the values provided in this arrangement are for background information only.

Generally, it may take longer to obtain data relating to one type of signal particle compared to the other. For example, it generally takes longer to obtain data relating to backscattered signal particles than secondary signal particles. Therefore, when considering the optimal size of the inner and outer detecting portion, improving the detection efficiency for the backscatter signal particle (e.g. by making the inner detecting portion 405A smaller) may improve the overall detection efficiency, even though the secondary signal particle detection efficiency will be reduced.

Using a detector as described with an inner detecting portion 405A and an outer detecting portion 405B without switching any operational modes or states is beneficial in that the system can be simpler as additional control is not required for the switching. Additionally, the different types of signal particles can be detected (and distinguishable from each other) simultaneously. However, the detection efficiency for detecting each type of signal particle may generally be lower, at least in part because the area of the detector being used to detect the signal particle is reduced for each different type of signal particle.

The width (e.g. diameter) of the first detecting portion 405A may be approximately 2 µm to 100 µm. Preferably, the width (e.g. diameter) of the first detecting portion 405A may be approximately 10 µm to 50 µm. Preferably, the width (e.g. diameter) of the first detecting portion 405A may be approximately 20 µm to 30 µm. The width (e.g. diameter) of the first detecting portion 405A may be less than or equal to approximately 100 µm. The width (e.g. diameter) of the first detecting portion 405A may be less than or equal to approximately 50 µm. The width (e.g. diameter) of the first detecting portion 405A may be less than or equal to approximately 30 µm. The width (e.g. diameter) of the first detecting portion 405A may be greater than or equal to approximately 2 µm. The width (e.g. diameter) of the first detecting portion 405A may be greater than or equal to approximately 10 µm. The width (e.g. diameter) of the first detecting portion 405A may be greater than or equal to approximately 20 lam.

The width (e.g. diameter) of the second detecting portion 405B may be approximately 10 µm to 250 µm. Preferably, the width of the second detecting portion 405B may be approximately 10 µm to 150 µm. The width (e.g. diameter) of the second detecting portion 405B may be less than or equal to approximately 250 µm. The width (e.g. diameter) of the second detecting portion 405B may be less than or equal to approximately 150 µm. The width (e.g. diameter) of the second detecting portion 405B may be greater than or equal to approximately to 10 µm. The size of the corresponding portions, e.g. the width/diameter of the inner annular portion 405A and/or the outer annular portion 405B may be designed or selected in order to detect the particular charged particles of interest at each of the portions of the detector.

Although the above described example is used for detecting secondary charged particles, the same double ring detector (including any/all of the variations described above) can be used to distinguish between different backscatter charged particles based on the trajectory of the charged particles.

Detectors used to detect backscatter charged particles may be limited in predominantly detecting backscatter charged particles in a certain angle range, e.g. large angle range, relative to the optical axis of the primary sub-beam. Backscatter charged particles of having different trajectory ranges provide different information about the structure within a sample. For example backscatter charged particles with small trajectory angles (i.e. having a small angle with the optical axis) may have information relating to features at depth within the sample. Backscatter charged particles with larger angle trajectories have information such the topology of the sample. However, the detection signal derived from the detected charge particles may have a component from the larger angle backscatter charged particles that provides a large background. Consequently the component of the detection signal from the small angle backscatter charged particles may be drowned out or flooded by the component from the larger angle backscatter charged particles. The component of the detection signal from the small angle backscatter charged particles may be substantially indistinguishable in the net detection signal. As the information of the detected charged particles may be renderable as an image from which contrast may be perceived, the contrast of the buried features at depth may be flooded or drowned by the topological contrast derived from the larger-angle backscatter charged.

In this example, the detection signal is of backscatter charged particles. Secondary charged particles are filtered out. To this end, the secondary charged particles are repelled, as described in any of the above embodiments. Thus, a difference to the example above (in which secondary and backscatter charged particles are detected) may be the field applied to the charged particles. In particular, in this instance, the field between the sample 208 and the detector array 241 (e.g. which is used to accelerate the primary sub-beam) decelerates secondary and backscatter charged particles. The field will generally affect the secondary charged particles more than the backscatter charged particles and will repel the secondary charged particles (i.e. back towards the sample 208). The larger the electric field between sample 208 and detector array 241, the stronger this effect is. As a result, the detector array 241 can be used to detect predominantly backscatter charged particles, wherein smaller angle charged particles can be detected by the inner detecting portion 405A and backscatter charged particles can be detected by the outer detecting portion 405B (i.e. radially outwards of the inner portion). In other words, smaller angle and larger angle backscatter charged particles can be detected substantially separately, and preferably simultaneously, by using the difference in backscatter charged particle trajectories. The size of the inner and outer detecting portions could be optimized or selected (e.g. using the above described dimensions) depending on the detection of the backscatter charged particles.

The detector comprising multiple portions as described above (e.g. as shown in relation to FIGS. 13A and/or 13B) may be provided in any of the embodiments or variations described herein. Furthermore, the detector comprising multiple portions as described above (e.g. as shown in relation to FIGS. 13A and/or 13B) may be provided in combination with any additional detector array. For example, the detector as shown in FIGS. 13A and/or 13B may be provided in combination with another detector array positioned above or below any of the electrodes of the objective lens array. Any additional detector arrays may be facing towards the sample, as shown in FIG. 15, or could be facing upbeam of the primary sub-beams, i.e. facing away from the sample.

The charged particle optical device is described in the above aspects as being provided as, or as part of, as charged particle system or assessment tool. It is not necessary to include all the features of such larger systems or tools, although they can optionally be included as part of the charged particle optical device.

FIG. 16 is a schematic diagram of an exemplary electron-optical system having the charged particle device as in any of the above described options or aspects. The charged particle device may be provided as an objective lens array assembly. The charged particle device comprises the objective lens array 241. The objective lens array 241 comprises a plurality of objective lenses. The charged particle optical device having at least the objective lens array 241 as described in any of the aspects or embodiments above may be used in the electron-optical system as shown in FIG. 16. The objective lens array 241 may be an exchangeable module as described above. For conciseness, features of the objective lens array 241 that have already been described above may not be repeated here.

The charged particle optical device as described above can be used for the detection of backscatter charged particles in the system of FIG. 16 (as above).

There are some considerations specific to the set up of FIG. 16. In the present example, it is preferable to keep the pitch small so as to avoid negatively impacting throughput. However, when the pitch is too small, this can lead to cross-talk. Therefore, the pitch size is a balance of effective backscatter charged particle detection and throughput. Thus, the pitch is preferably approximately 300 µm, which is 4-5 times larger than it might otherwise be for the example of FIG. 16 when detecting secondary charged particles. When the distance between the detector and the sample 208 is reduced, the pitch size can also be reduced without negatively affecting the cross-talk. Therefore, providing the detector as close as possible to the sample (i.e. with distance L as small as possible, and preferably less than or equal to approximately 50 µm, or less than or equal to approximately 40 µm, or less than or equal to approximately 30 µm, or less than or equal to approximately 20 µm, or equal to approximately 10 µm), is beneficial in allowing the pitch to be as large as possible which improves throughput.

As shown in FIG. 16, the electron-optical system comprises a source 201. The source 201 provides a beam of charged particles (e.g. electrons). The multi-beam focused on the sample 208 is derived from the beam provided by the source 201. Sub-beams 211, 212, 213 may be derived from the beam, for example, using a beam limiter defining an array of beam-limiting apertures. The beam may separate into the sub-beams 211, 212, 213 on meeting the control lens array 250. The sub-beams 211, 212, 213 are substantially parallel on entry to the control lens array 250. The source 201 is desirably a high brightness thermal field emitter with a good compromise between brightness and total emission current. In the example shown, a collimator is provided up-beam of the objective lens array assembly. The collimator may comprise a macro collimator 270. The macro collimator 270 acts on the beam from the source 201 before the beam has been split into a multi-beam. The macro collimator 270 bends respective portions of the beam by an amount effective to ensure that a beam axis of each of the sub-beams derived from the beam is incident on the sample 208 substantially normally (i.e. at substantially 90° to the nominal surface of the sample 208). The macro collimator 270 applies a macroscopic collimation to the beam. The macro collimator 270 may thus act on all of the beam rather than comprising an array of collimator elements that are each configured to act on a different individual portion of the beam. The macro collimator 270 may comprise a magnetic lens or magnetic lens arrangement comprising a plurality of magnetic lens sub-units (e.g. a plurality of electromagnets forming a multi-pole arrangement). Alternatively or additionally, the macro-collimator may be at least partially implemented electrostatically. The macro-collimator may comprise an electrostatic lens or electrostatic lens arrangement comprising a plurality of electrostatic lens sub-units. The macro collimator 270 may use a combination of magnetic and electrostatic lenses.

In another arrangement (not shown), the macro-collimator may be partially or wholly replaced by a collimator element array provided down-beam of the upper beam limiter. Each collimator element collimates a respective sub-beam. The collimator element array may be formed using MEMS manufacturing techniques so as to be spatially compact. The collimator element array may be the first deflecting or focusing electron-optical array element in the beam path down-beam of the source 201. The collimator element array may be up beam of the control lens array 250. The collimator element array may be in the same module as the control lens array 250.

In the example of FIG. 16 a macro scan deflector 265 is provided to cause sub-beams to be scanned over the sample 208. The macro scan deflector 265 deflects respective portions of the beam to cause the sub-beams to be scanned over the sample 208. In some embodiments, the macro scan deflector 265 comprises a macroscopic multi-pole deflector, for example with eight poles or more. The deflection is such as to cause sub-beams derived from the beam to be scanned across the sample 208 in one direction (e.g. parallel to a single axis, such as an X axis) or in two directions (e.g. relative to two non-parallel axes, such as X and Y axes). The macro scan deflector 265 acts macroscopically on all of the beam rather than comprising an array of deflector elements that are each configured to act on a different individual portion of the beam. In the example shown, the macro scan deflector 265 is provided between the macro collimator 270 and the control lens array 250.

In another arrangement (not shown), the macro scan deflector 265 may be partially or wholly replaced by a scan deflector array. The scan-deflector array 260 comprises a plurality of scan deflectors. The scan-deflector array 260 may be formed using MEMS manufacturing techniques. Each scan deflector scans a respective sub-beam over the sample 208. The scan-deflector array 260 may thus comprise a scan deflector for each sub-beam. Each scan deflector may deflect the sub-beam in one direction (e.g. parallel to a single axis, such as an X axis) or in two directions (e.g. relative to two non-parallel axes, such as X and Y axes). The deflection is such as to cause the sub-beam to be scanned across the sample 208 in the one or two directions (i.e. one dimensionally or two dimensionally). The scan deflector array may be up beam of an objective lens array 241. The scan deflector array may be down beam of a control lens array 250. Although reference is made to a single sub-beam associated with a scan deflector, groups of sub-beams may be associated with a scan deflector. In some embodiments, the scanning deflectors described in EP2425444, which document is hereby incorporated by reference in its entirety specifically in relation to scan deflectors, may be used to implement the scan-deflector array. A scan-deflector array (e.g. formed using MEMS manufacturing techniques as mentioned above) may be more spatially compact than a macro scan deflector. The scan deflector array may be in the same module as the objective lens array 241.

In other embodiments both a macro scan deflector 265 and the scan-deflector array are provided. In such an arrangement, the scanning of the sub-beams over the sample surface may be achieved by controlling the macro scan deflector and the scan-deflector array 260 together, preferably in synchronization.

The objective lens array assembly may further comprise a collimator array and/or a scan deflector array.

The embodiments of the present disclosure can be applied to various different tool architectures. For example, the electron beam tool 40 may be a single beam tool, or may comprise a plurality of single beam columns or may comprise a plurality of columns of multi-beams. The columns may comprise the charged particle optical device described in any of the above embodiments or aspects. As a plurality of columns (or a multi-column tool), the devices may be arranged in an array which may number two to one hundred columns or more. The charged particle device may take the form of an example as described with respect to and depicted in FIG. 3 or as described with respect to and depicted in FIG. 16, although preferably having an electrostatic scan deflector array and an electrostatic collimator array. The charged particle optical device may be a charged particle optical column. A charged particle column may optionally comprise a source.

An assessment tool according to some embodiments may be a tool which makes a qualitative assessment of a sample (e.g., pass/fail), one which makes a quantitative measurement (e.g., the size of a feature) of a sample or one which generates an image of map of a sample. Examples of assessment tools are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools). The electron-optical column 40 may be a component of an assessment tool; such as an inspection tool or a metro-inspection tool, or part of an e-beam lithography tool. Any reference to a tool herein is intended to encompass a device, apparatus or system, the tool comprising various components which may or may not be collocated, and which may even be located in separate rooms, especially for example for data processing elements.

Reference to a component or system of components or elements being controllable to manipulate a charged particle beam in a certain manner includes configuring a controller or control system or control unit to control the component to manipulate the charged particle beam in the manner described, as well as optionally using other controllers or devices (e.g. voltage supplies and/or current supplies) to control the component to manipulate the charged particle beam in this manner. For example, a voltage supply may be electrically connected to one or more components to apply potentials to the components, such as in a non-limited list including the control lens array 250, the objective lens array 241, the condenser lens 231, correctors, collimator element array 271 and scan deflector array 260, under the control of the controller or control system or control unit. An actuatable component, such as a stage, may be controllable to actuate and thus move relative to another components such as the beam path using one or more controllers, control systems, or control units to control the actuation of the component.

The embodiments herein described may take the form of a series of aperture arrays or electron-optical elements arranged in arrays along a beam or a multi-beam path. Such electron-optical elements may be electrostatic. In some embodiments, all the electron-optical elements, for example, from a beam limiting aperture array to a last electron-optical element in a sub-beam path before a sample, may be electrostatic and/or may be in the form of an aperture array or a plate array. In some arrangements one or more of the electron-optical elements are manufactured as a microelectromechanical system (MEMS) (i.e. using MEMS manufacturing techniques).

The system or device of such architectures as depicted in at least FIGS. 3 and 16 and as described above may comprise components such as an upper beam limiter 252, a collimator element array 271, a control lens array 250, a scan deflector array 260, an objective lens array 241, a beam shaping limiter 242 and/or a detector array 240; one or more of these elements that are present may be connected to one more adjacent elements with an isolating element such as a ceramic or glass spacer.

The embodiments of the present disclosure may be embodied as a computer program. For example, a computer program may comprise instructions to instruct the controller 50 to perform the following steps. The controller 50 controls the electron beam apparatus to project an electron beam towards the sample 208. In some embodiments, the controller 50 controls at least one electron-optical element (e.g., an array of multiple deflectors or scan deflectors 260, 265) to operate on the electron beam in the electron beam path. Additionally or alternatively, in some embodiments, the controller controls at least one electron-optical element (e.g., the detector array 240) to operate on the electron beam emitted from the sample 208 in response to the electron beam.

References to upper and lower, up and down, above and below should be understood as referring to directions parallel to the (typically but not always vertical) up-beam and down-beam directions of the electron beam or multi-beam impinging on the sample 208. Thus, references to up beam and down beam are intended to refer to directions in respect of the beam path independently of any present gravitational field. Up-beam being towards the source and down-beam being towards the sample.

In some embodiments, a method is provided of projecting a plurality of charged particle beams (e.g., sub-beams) onto a sample 208 so as to generate a greater proportion of backscatter charged particles in the charged particles emitted from the sample 208. As described above, this is beneficial in obtaining information only available from backscattered signals.

The method comprises projecting the charged particle beams onto a surface of the sample 208 comprising accelerating the charged particle beams in an objective lens array 241. As described above, the accelerating can be carried out by providing electrodes (e.g. the first electrode 242 and the second electrode 243), through which the charged particle beams travel, and which have potentials used to accelerate the charged particle beams. Preferably, the method comprises providing a plurality of objective lenses (such as objective lens array 241); using the plurality of objective lenses to project the charged particle beams onto a surface of the sample 208; using the plurality of objective lenses to accelerate the charged particle beams onto the sample 208 and detecting charged particles emitted from the sample.

Additionally or alternatively, the method comprises repelling secondary charged particles emitted from the sample. Preferably, the method comprises providing a plurality of objective lenses (such as objective lens array 241); using the plurality of objective lenses to project the charged particle beams onto a surface of the sample 208; using the device to repel the secondary charged particles emitted from the sample 208; and detecting charged particles emitted from the sample.

In some embodiments, a method is provided comprising directing an array of beams of charged particles at a sample surface, and directly detecting backscatter charged particles coming from that surface. The method may further comprise repelling secondary charged particles from the sample surface.

In some embodiments, a method is provided of selectively detecting secondary charged particles and backscatter charged particles emitted from a sample 208. The method comprises selecting a mode of operation of a detector between: a backscatter mode for detecting more backscatter charged particles than secondary charged particles; and a secondary mode for detecting more secondary charged particles than backscatter charged particles. The detection of the backscattered charged particles can be optimized in the backscatter mode and the detection of the secondary charged particles can be optimized in the secondary mode. The method further comprises projecting a plurality of charged particle beams (e.g. sub-beams 211, 212, 213) onto a surface of the sample 208, and detecting charged particles emitted from the sample 208 in the selected mode of operation. Preferably, the method comprises providing a plurality of objective lenses (such as objective lens array 241) and at least one sensor and using the plurality of objective lenses to project the charged particle beams onto a surface of the sample 208. In a first operation state, the method comprises detecting more secondary charged particles than backscatter charged particles, and in a second operation state, the method comprises detecting more backscattered charged particles than secondary charged particles. Optionally, the method further comprises accelerating the charged particle beams in an objective lens array in the backscatter mode and/or decelerating the charged particle beams in an objective lens array in the secondary mode.

In some embodiments, a method is provided of simultaneously detecting secondary charged particles and backscatter charged particles emitted from a sample. The method comprises providing a detector array comprising at least two detecting portions configured to detect signal particles from the sample simultaneously, wherein one of the detecting portions is configured to detect more backscattered charged particles than secondary charged particles and the other detecting portion is configured to detect more secondary charged particles than backscattered charged particles. The method comprises projecting charged particle beams towards a sample. The method further comprises capturing charged particles emitted from the sample so as to detect primarily secondary charged particles at one detecting portion and primarily backscatter charged particles at the other detecting portion.

In some embodiments, a method is provided of detecting secondary charged particles and backscatter charged particles emitted from the sample 208. The method comprises selecting a mode of operation of a detector between a backscatter mode for detecting more backscatter charged particles than secondary charged particles, and a secondary mode for detecting more secondary charged particles than backscatter charged particles. The method comprises capturing charged particles emitted from the sample 208 so as to detect charged particles in the selected mode. Preferably, the method comprises: providing at least one sensor configured to capture charged particles emitted from the sample 208. The method comprises in a first operation state, detecting more secondary charged particles than backscatter charged particles, and in a second operation state, detecting more backscattered charged particles than secondary charged particles.

Preferably, the previous methods further comprise repelling secondary charged particles emitted from the sample 208. As described above, the repelling may be carried out by controlling potentials of electrodes in the objective lens array 241 and a potential of the sample.

In some embodiments, a method is provided of operating a charged particle assessment tool for detecting backscatter charged particles, the method comprising: projecting a multi-beam of charged particles towards a sample surface; repelling charged particles emitted (i.e., emanating) from the sample in response to the multi-beam that have an energy less than a threshold. The method includes detecting charged particles emanating from the sample and having an energy at least the threshold, using a detector array 240 positioned proximate the sample 208. Preferably, the threshold exceeds an energy of a secondary charged particle emitted from the sample. Preferably, the projecting comprises accelerating the multi-beam of charged particles towards the sample 208, the accelerating preferably in the objective lens array 241. Preferably, the repelling uses an electrode of the objective lens.

Preferably the methods described herein further comprise providing an intermediate focus 236 between respective control lenses and corresponding objective lenses.

In any of the methods, in the detecting, more backscatter charged particles may be detected than secondary charged particles. Thus, the methods can be used to detect primarily backscattered charged particles as described above.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector. References to elements being aligned along a beam path or sub-beam path are understood to mean that the respective elements are positioned along the beam path or sub-beam path. References to optics are understood to mean electron-optics.

The charged-particle optical device may be a negative charged particle device. The charged-particle optical device may otherwise be referred to as an electron-optical device. It will be understood that an electron is a specific charged particle and can replace all instances of charged particle referred to throughout the application as appropriate. For example, the source may specifically provide electrons. The charged particle referred to throughout the specification may be specifically a negatively charged particle.

The charged particle-optical device may more specifically be defined as a charged particle-optical column. In other words, the device may be provided as a column. The column may thus comprise an objective lens array assembly as described above. The column may thus comprise a charged particle optical system as described above, for example comprising an objective lens array and optionally a detector array and/or optionally a condenser lens array.

The charged particle optical device described above comprises at least the objective lens array 240. The charged particle optical device may comprise the detector array 241. The charged particle optical device may comprise the control lens array 250. The charged particle optical device comprising the objective lens array and the detector array may thus be interchangeable with, and referred to as, the objective lens array assembly, which may optionally comprise the control lens array 250. The charged particle optical device may comprise additional components described in relation to either of FIG. 3 and/or FIG. 16. Thus, the charged particle optical device may be interchangeable with, and referred to as, a charged particle assessment tool 40 and/or an electron optical system if comprising the additional components in these figures.

While the present disclosure has described various embodiments, other embodiments will be apparent to those skilled in the art from consideration of the specification and practice of the embodiments disclosed herein.

An insulating structure is described in relation to adjacent electrodes above. In some instances, the insulating structure is described in relation to a first and/or second electrode specifically. The insulating structure may be applied to any adjacent electrodes and reference to the first and second electrode may be replaced with other electrodes. If more than two electrodes are provided, multiple insulating structures may be provided. For example, there may be a sequence of insulating structures.

Any element or collection of elements may be replaceable or field replaceable within the electron beam tool 40. The one or more electron-optical components in the electron beam tool 40, especially those that operate on sub-beams or generate sub-beams, such as aperture arrays and manipulator arrays may comprise one or more MEMS.

It is intended that the specification and examples be considered as exemplary only, with a true scope and spirit of the invention being indicated by at least the following claims and clauses.

In an arrangement there is provided: Clause 1: A charged particle-optical device for a charged particle assessment tool, the device being configured to project a multi-beam of charged particles along sub-beam paths towards a sample, the multi-beam comprising sub-beams, the device comprising: an objective lens array configured to project an array of charged particle sub-beams onto the sample, desirably the objective lens array is arranged across the sub-beam paths of the array of charged particle sub-beams, desirably the objective lens array is arranged to correspond to the sub-beam paths of the array of charged particle sub-beams, desirably each objective lens corresponding to a sub-beam of the array of charged particle sub-beams; and a detector array configured to be proximate the sample and configured to capture charged particles emitted from the sample, desirably the detector array is arranged across the sub-beam paths of the array of charged particle sub-beams, desirably the detector array is arranged to correspond to the sub-beam paths of the array of charged particle sub-beams, desirably each detector of the detector array corresponding to a sub-beam of the array of charged particle sub-beams, desirably the detector array configured to face a sample desirably during operation, desirably the detector array being the most down beam component of the device, wherein the charged particle-optical device is configured to repel secondary charged particles emitted from the sample away from the detector.

Clause 2: A charged particle-optical device for a charged particle system, the device being configured to project an array of beams of charged particles towards a sample, the device comprising: an objective lens array configured to project the beams onto the sample and to repel secondary charged particles emitted from the sample; and an array of detectors proximate the sample so as to detect backscatter particles from the sample.

Clause 3: The charged particle-optical device of clause 1 or 2, wherein the objective lenses are configured to accelerate the charged particle sub-beams along the sub-beam paths.

Clause 4: A charged particle-optical device for a charged particle assessment tool, the device being configured to project a multi-beam of charged particles along sub-beam paths towards a sample, the multi-beam comprising sub-beams, the device comprising: an objective lens array configured to project an array of charged particle sub-beams onto the sample, wherein desirably the objective lens array comprises at least two electrodes in which are defined aperture arrays, desirably corresponding apertures of the aperture arrays in the at least two electrodes are each aligned with, and arranged along, a sub-beam path of the array of charged particle sub-beams; and a detector array configured to be proximate a sample and configured to capture charged particles emitted from the sample, wherein the objective lenses are configured to accelerate the charged particle sub-beams along the sub-beam paths.

Clause 5: A charged particle-optical device for a charged particle system, the device being configured to project an array of beams of charged particles towards a sample, the device comprising: an objective lens array configured to project the beams onto the sample and to accelerate the charged particles towards the sample; and an array of detectors proximate the sample so as to detect backscatter particles from the sample.

Clause 6: The charged particle-optical device of clause 4 or 5, wherein the charged-particle optical device is configured to repel secondary charged particles emitted from the sample away from the detector.

Clause 7: The charged particle-optical device of any preceding clause, wherein the detector array is configured in use to have a potential and the sample is configured in use to have a potential, wherein the sample potential is more positive than the detector array potential.

Clause 8: The charged particle-optical device of clause 7, wherein the potential difference between the sample potential and the detector array potential is greater than a secondary electron threshold.

Clause 9: The charged particle-optical device of any preceding clause, wherein the objective lens array comprises at least two electrodes in which are defined aperture arrays, corresponding apertures in the at least two electrodes are aligned with and arranged along a sub-beam path, desirably the detector array may be provided on or adjacent or integrated into one of the at least two electrodes.

Clause 10: The charged particle-optical device of clause 9, wherein a first electrode of the at least two electrodes is up-beam of a second electrode of the at least two electrodes, the first electrode being configured in use to have a first electrode potential and the second electrode being configured in use to have a second electrode potential, wherein the second electrode potential is more positive than the first electrode potential, desirably the detector array is positioned on or in or integral to the second electrode, desirably the most down beam electrode of the at least two electrodes.

Clause 11: The charged particle-optical device of clause 10, wherein the sample is configured to be at a potential in use, wherein the sample potential is more positive than the second electrode potential.

Clause 12: The charged particle-optical device of clause 11, wherein the sample potential is approximately +20 kV to +100 kV relative to a source of the charged particle beam, and preferably, the sample potential is approximately +20 kV to +70 kV.

Clause 13: The charged particle-optical device of any one of clauses 10 to 12, wherein the first electrode potential is between approximately +3 kV to +8 kV relative to a source of the charged particle beam, and preferably, the first electrode potential is approximately +5 kV.

Clause 14: The charged particle-optical device of any one of clauses 10 to 13, wherein the second electrode potential is approximately +20 kV to +100 kV relative to a source of the charged particle beam, and preferably, the second electrode potential is approximately +20 kV to +70 kV.

Clause 15: The charged particle-optical device of any one of clauses 9 to 14, wherein the diameter of the apertures in at least one electrode is between approximately 30 to 300 μm.

Clause 16: The charged particle-optical device of any one of clauses 9 to 15, wherein the pitch between adjacent apertures in at least one electrode is between approximately 50 μm and 500 μm.

Clause 17: The charged particle-optical device of any one clauses 9 to 16, further comprises an insulating structure separating adjacent electrodes, the insulating structure comprising of a main body and a protrusion radially inwards of the main body, the main body having a first side and a second side, the second side opposing the first side, wherein one of the electrodes contacts the main body and the protrusion on the first side of the insulating structure, and the main body contacts another of the electrodes on the second side of the insulating structure and a gap is defined between the protrusion and the other of the electrodes.

Clause 18: The charged particle-optical device of any of the preceding clauses, further comprising a control lens array positioned up-beam of the objective lens array, wherein each control lens is associated with a respective objective lens; desirably such that the control lens array is arranged to correspond to the objective lens array, desirably the control lens array is arranged across the sub-beam paths of the array of charged particle sub-beams desirably the control lens array corresponding to an array of sub-beam paths of the array of charged particle sub-beams, desirably each control lens is associated with a respective sub-beam path the array of charged particle sub-beams.

Clause 19: The charged particle-optical device of clause 18, wherein the control lens array is configured to provide an intermediate focus between respective control lenses and corresponding objective lenses.

Clause 20: The charged particle-optical device of either or clauses 18 or 19, wherein the control lens array is configured to decelerate the charged particle sub-beams along the sub-beam paths.

Clause 21: The charged particle-optical device of any preceding clause, wherein the detector array is configured to detect more backscattered charged particles than secondary charged particles.

Clause 22: The charged particle-optical device of any preceding clause, wherein the detector array is positioned between approximately 10 μm to 50 μm of the sample.

Clause 23: The charged particle-optical device of any one of the preceding clauses, further comprising an electric power source which is configured to apply potentials to the at least one electrode of the objective lens array and/or the sample in use.

Clause 24: An objective lens assembly for projecting a multi-beam of charged particles towards a sample surface, the objective lens assembly comprising: an objective lens array comprising at least two electrodes arranged along the path of the multi-beam and in which are defined a plurality of apertures, desirably corresponding apertures of the plurality of apertures in each of the at least two electrodes are aligned with and arranged along a sub-beam path of the path of the multi-beam, and a detector array configured to detect charged particles emanating from the sample in response to the multi-beam, wherein: the detector array is configured to be positionable proximate to the sample and is configured to repel secondary electrons emanating from the sample away from the detector.

Clause 25: The objective lens assembly of clause 24, wherein the sample is set to a sample potential and the detector array is set to a detector array potential, and the potential difference between the sample potential and the detector array potential is greater than a secondary electron threshold.

Clause 26: The objective lens assembly of clause 25, wherein the secondary electron threshold is the potential difference equivalent to the likely electron energy of a secondary electron emanating from the sample.

Clause 27: The objective lens assembly of any one of clauses 24 to 26, wherein the detector array is configured to detect more backscatter electrons than secondary electrons.

Clause 28: A charged particle-optical device for a multi-beam charged particle assessment tool, the device being configured to project a multi-beam of charged particles along sub-beam paths towards a sample, the multi-beam comprising sub-beams, the device comprising: an objective lens array configured to project an array of charged-particle sub-beams onto the sample; and a detector array configured to capture charged particles emitted from the sample, wherein the device is configured to switch between two operation states, wherein in a first operation state, the detector array is configured to detect more secondary charged particles than backscatter charged particles, and in a second operation state, the detector array is configured to detect more backscattered charged particles than secondary charged particles.

Clause 29: A charged particle-optical device for a charged particle system, the device being configured to project an array of beams of charged particles towards a sample, the device comprising: an objective lens array configured to project the beams onto the sample; and an array of detectors configured to detect backscatter particles from the sample, wherein the device is configured to switch between two operation states, wherein in a first operation state, the detector array is configured to detect more secondary charged particles than backscatter charged particles, and in a second operation state, the detector array is configured to detect more backscattered charged particles than secondary charged particles.

Clause 30: The charged particle-optical device of clause 28 or 29, wherein in the first operation state, the objective lenses are configured to decelerate the charged particle beam onto the sample, and in the second operation state, the objective lenses are configured to accelerate the charged particle beam onto the sample.

Clause 31: The charged particle-optical device of any of clauses 24, 29 or 30, wherein the objective lens array is configured to maintain a focus of the charged-particle sub-beams on the sample in the first and second operation states.

Clause 32: The charged particle-optical device of any one of clauses 28 to 31, wherein the objective lens array comprises a first electrode configured to have a first electrode potential and a second electrode configured to have a second electrode potential, the first electrode being up-beam of the second electrode.

Clause 33: The charged particle-optical device of clause 32, wherein in the first operation state, the first electrode potential is more positive than the second electrode potential.

Clause 34: The charged particle-optical device of either of clauses 32 or 33, wherein in the second operation state, the second electrode potential is more positive than the first electrode potential.

Clause 35: The charged particle-optical device of any one of clauses 32 to 34, wherein at least the first electrode potential is adjusted between the first and second operation states to maintain a focus of the primary beam on the sample in the first and second operation states.

Clause 36: The charged particle-optical device of any one clauses 32 to 35, wherein adjacent electrodes are separated by an insulating structure which is configured for use in the first operation state and the second operation state, preferably wherein the objective lens array comprises the insulating structure Clause 37: The charged particle-optical device of clause 36, wherein the insulating structure is formed of a main body and a protrusion radially inwards of the main body, the main body featuring a first and second side, the first side opposing the second side, wherein: on the first side of the insulating structure the main body contacts one of the electrodes and a first gap is formed between the protrusion and the one of the electrodes, and on the second side of the insulating structure, the main body contacts another one of the electrodes and a second gap is formed between the protrusion and the other of the electrodes.

Clause 38: The charged particle-optical device of any one of clauses 32 to 31, further comprising an electric power source which is configured to apply the first electrode potential to the first electrode and/or the second electrode potential to the second electrode.

Clause 39: The charged particle-optical device of any one of clauses 28 to 38, wherein the detector array is configured to be proximate the sample.

Clause 40: The charged particle-optical device of any one of clauses 28 to 39, wherein the device is configured to maintain a distance between the detector array and the sample between the first and second operation states and vice versa.

Clause 41: The charged particle-optical device of any one of clauses 28 to 40, wherein the device is configured to alter the distance between the detector array 240 and the sample 208 so that the secondary charged particles are focused on the detector array 240 when in the first operation state and the backscattered charged particles are focused on the detector array 240 when in the second operation state Clause 42: The charged particle-optical device of any one of clauses 28 to 41, wherein the device is configured in use to alter a distance between the objective lens array and the sample when switching between the first and second operation states and vice versa.

Clause 43: The charged particle-optical device of clause 42, wherein the device is configured to reduce the distance between the objective lens array and the sample when switching to the second operation state.

Clause 44: The charged particle-optical device of either of clause 42 or clause 43, wherein
the device is configured to increase a distance between the objective lens array and the sample when switching to the first operation state.

Clause 45: The charged particle-optical device of any one of clauses 42 to 44, wherein the device is configured to move the objective lens array and/or the sample with respect to each other along the sub-beam paths so as to switch between the first and second operation states.

Clause 46: The charged particle-optical device of any one of clauses 42 to 45, further comprising an actuator configured to move the objective lens array so as to alter the distance between the objective lens array and the sample.

Clause 47: The charged particle-optical device of any one clauses 42 to 46, wherein the device is configured to move the sample so as to alter the distance between the objective lens array and the sample.

Clause 48: The charged particle-optical device of any one of clauses 42 to 47, wherein the objective lens array is configured to be part of a switchable module, different modules having an objective lens array at different distances from the sample along the sub-beam path.

Clause 49: The charged particle-optical device of any one of clauses 28 to 48, wherein the device is configured to switch the device between the first and second operation state continuously.

Clause 50: The charged particle-optical device of clause 49, wherein the switching comprises turning on and off a repulsion potential so that when the repulsion is on, the is configured to repel secondary charged particles.

Clause 51: The charged particle-optical device of either of clauses 49 or 50, wherein the continuous switching between the first and second operation state provides substantially simultaneous detection of backscatter charged particles and secondary charged particles.

Clause 52: The charged particle-optical device of any one of clauses 49 to 51, wherein the device switches between the first operation state and the second operation state or vice versa at least once every few seconds, or at least once every second, or at least once every 100 ms, or at least once every 10 ms.

Clause 53: The charged particle-optical device of any one of clauses 49 to 52, wherein the landing energy in the first operation state and the second operation state is substantially the same and/or is substantially maintained.

Clause 54: A detector for a charged particle assessment tool, wherein the detector is configured to capture charged particles emitted from a sample, and wherein the detector is configured to switch between two operation states, wherein in a first operation state, the at least one detector is configured to detect more secondary charged particles than backscatter charged particles, and in a second operation state, the at least one detector is configured to detect more backscattered charged particles than secondary charged particles.

Clause 55: A detector for a charged particle assessment tool, wherein the detector is configured to capture charged particles emitted from a sample, and the detector comprises an inner detecting portion surrounding the aperture; and an outer detecting portion, radially outwards of the inner detecting portion, wherein the detector is configured to switch between two operation states, the two states using a different configuration of the detecting portions, respectively.

Clause 56: The detector of clause 54 or 55, in which an aperture is defined and configured for the through passage of a charged particle beam, the detector comprising: an inner detecting portion surrounding the aperture; and an outer detecting portion, radially outwards of the inner detecting portion.

Clause 57: The detector of clause 56, wherein in the first operation state, the detector uses the inner detecting portion and not the outer detecting portion.

Clause 58: The detector of either of clauses 56 or 57, wherein in the second operation state, the detector uses at least the outer detecting portion.

Clause 59: The detector of any one of clauses 54 to 58, wherein the diameter of the first detecting portion is approximately 40-60 μm and/or the diameter of the second detecting portion is approximately 150 to 250 μm.

Clause 60: A detector array for a charged particle assessment tool configured to operate: in a backscatter operational state to detect preferably backscatter charged particles; and in a secondary charged particle state to detect preferably secondary charged particles, the detector array comprising an array of detectors as claimed in any one of clauses 54 to 59.

Clause 61: A charged particle-optical device for a for a multi-beam charged particle assessment tool comprising: an objective lens array; and a detector array, the detector array comprising an array of detectors as claimed in any one of clauses 54 to 59, wherein the apertures in the electrodes of objective lens array and the detector array are arranged on sub-beam paths of the charged particle multi-beam.

Clause 62: A charged particle-optical device for a multi-charged particle beam assessment tool, the device being configured to project charged particles beams along primary beam paths towards a sample, the device comprising: an objective lens array configured to project an array of charged particle sub-beams onto the sample; and a detector array associated with the objective lens array, and comprising at least two detecting portions configured to detect charged particles from the sample simultaneously, wherein one of the detecting portions is configured to detect more backscattered charged particles than secondary charged particles and the other detecting portion is configured to detect more secondary charged particles than backscattered charged particles.

Clause 63: The charged particle-optical device of either of clause 62, wherein the one of the detecting portions is an outer detecting portion, and the other detecting portion is an inner detecting portion surrounding an aperture for the passage therethrough of a charged particle beam, the inner detecting portion being radially inwards of the outer detecting portion, preferably wherein the inner portion and the outer portion are ring-shaped.

Clause 64: The charged particle-optical device of clause 62 or 63, wherein the diameter of the inner portion is between approximately 10 micrometers and 50 micrometers.

Clause 65: The charged particle-optical device of any one of clauses 62 to 64, wherein an insulating portion is provided between the detecting portions to prevent signals passing between the portions.

Clause 66: A charged particle-optical device for a multi-charged particle beam assessment tool, the device being configured to project charged particles beams along primary beam paths towards a sample, the device comprising: an objective lens array configured to project an array of charged particle sub-beams onto the sample; and a detector array associated with the objective lens array, and at least one detector of the detector array comprising at least two detecting portions configured to detect signal particles from the sample simultaneously, wherein the different detecting portions are configured to detect primarily different types of signal particle to each other.

Clause 67: The charged particle-optical device of any one of clauses 1 to 23 or 28 to 53, wherein the detector array comprises the detector of any of clauses 54 to 59.

Clause 68: The objective lens assembly of any one of clauses 24 to 27, wherein the detector array comprises the detector of any one of clauses 54 to 59.

Clause 69: A method of projecting a plurality of charged particle beams onto a sample so as to detect a greater proportion of backscatter charged particles in the charged particles emitted from the sample, the method comprising: a) projecting the charged particle beams onto a surface of the sample; and b) repelling secondary charged particles emitted from the sample.

Clause 70: A method of projecting a plurality of charged particle beams onto a sample so at to detect a greater proportion of backscatter charged particles in the charged particles emitted from the sample, the method comprising: a) projecting the charged particle beams onto a surface of the sample comprising accelerating the charged particle beams in an objective lens array.

Clause 71: A method comprising: directing an array of beams of charged particles at a sample surface; and directly detecting backscatter charged particles coming from that surface.

Clause 72: The method of clause 71, further comprising repelling secondary charged particles from the sample surface.

Clause 73: A method of selectively detecting secondary charged particles and backscatter charged particles emitted from a sample, the method comprising: a) selecting a mode of operation of a detector between: a backscatter mode for detecting more backscatter charged particles than secondary charged particles; and a secondary mode for detecting more secondary charged particles than backscatter charged particles; b) projecting a plurality of charged particle beams onto a surface of the sample; and c) detecting charged particles emitted from the sample in the selected mode of operation.

Clause 74: The method of clause 73, further comprising accelerating the charged particle beams in an objective lens array in the backscatter mode and/or decelerating the charged particle beams in an objective lens array in the secondary mode.

Clause 75: A method of detecting secondary charged particles and backscatter charged particles emitted from a sample, the method comprising: a) selecting a mode of operation of a detector between: a backscatter mode for detecting more backscatter charged particles than secondary charged particles; and a secondary mode for detecting more secondary charged particles than backscatter charged particles; b) capturing charged particles emitted from the sample so as to detect charged particles in the selected mode.

Clause 76: A method of simultaneously detecting secondary charged particles and backscatter charged particles emitted from a sample, the method comprising: a) providing an array of detectors, at least one detector of the array comprising at least two detecting portions configured to detect charged particles from the sample simultaneously, wherein one of the detecting portions is configured to detect more backscattered charged particles than secondary charged particles and the other detecting portion is configured to detect more secondary charged particles than backscattered charged particles; b) projecting charged particle beams towards a sample; c) capturing charged particles emitted from the sample so as to detect primarily secondary charged particles at one detecting portion and primarily backscatter charged particles at the other detecting portion.

Clause 77: A method of simultaneously detecting different types of signal particles emitted from a sample using a detector array, wherein at least one detector of the array comprises at least two detecting portions configured to detect signal particles from the sample simultaneously, the different detecting portions configured to detect preferentially different types of signal particle, the method comprising: a) projecting charged particle beams towards a sample; b) capturing with the detector array signal particles emitted from the sample comprising detecting preferentially different signal particles with different detection portions.

Clauses 78: The method of clause 77 wherein the different signal particles comprise backscatter charged particles and secondary charged particles Clause 79: The method of any one of clause 70 to 76 and 78, further comprising repelling secondary charged particles emitted from the sample.

Clause 80: A method of operating a charged particle assessment tool for detecting backscatter charged particles, the method comprising: a) projecting a multi-beam of charged particles towards a sample surface; desirably in an array of charged particle sub-beams through at least two electrodes in which are defined aperture arrays of objective lens arrays or desirably through an objective lens array in an array of charged particle sub-beams along across the objective lens array desirably through a control lens array and then the objective lens array, desirably the objective lens array comprising at least two electrodes desirably in which are defined aperture arrays; desirably corresponding apertures of the aperture arrays in the at least two electrodes being aligned with a sub-beam of the array of charged particle sub-beams, desirably such the sub beams pass through corresponding apertures of the aperture arrays in different electrodes of the at least two electrodes; b) repelling charged particles emanating from the sample in response to the multi-beam that have an energy less than a threshold; and c) detecting charged particles emitted from the sample and having an energy at least the threshold, using a detector array positioned proximate the sample.

Clause 81: The method of clause 80, wherein the threshold exceeds an energy of a secondary charged particle emanating from the sample.

Clause 82: The method of either of clauses 80 or 81, wherein the projecting comprises accelerating the multi-beam of charged particles towards the sample, the accelerating preferably in the objective lens array.

Clause 83: The method of any one of clauses 80 to 82, wherein the repelling uses at least the detector array.

Clause 84: The method of any one of clauses 69 to 83, further comprising providing an intermediate focus between respective control lenses and corresponding objective lenses.

Clause 85: The method of any one of clauses 69 to 84, wherein in the detecting, more backscatter charged particles are detected than secondary charged particles.

Clause 86: A method of detecting backscatter charged particles, the method comprising using a multi-beam charged particle assessment tool comprising the charged particle-optical device of any one of clauses 1 to 23, 28 to 53, and 61 to 67 or the objective lens assembly of any one of clauses 24 to 27 and 68.

The invention claimed is:

1. A charged particle-optical device configured to project a multi-beam of charged particles along sub-beam paths towards a sample, the multi-beam comprising sub-beams, the charged particle-optical device comprising:
an objective lens array configured to project an array of charged-particle sub-beams onto the sample; and
a detector array configured to capture charged particles emitted from the sample,
wherein the charged particle-optical device is configured to switch between two operation states, wherein in a first operation state, the detector array is configured to detect more secondary charged particles than backscattered charged particles, and in a second operation state, the detector array is configured to detect more backscattered charged particles than secondary charged particles.

2. The charged particle-optical device of claim 1, the objective lens array comprising an array of objective lenses configured to project a respective sub-beam onto the sample, wherein in the first operation state, the objective lenses are configured to decelerate the respective charged-particle sub-beams onto the sample, and in the second operation state, the objective lenses are configured to accelerate the charged-particle sub-beam onto the sample.

3. The charged particle-optical device of claim 1, wherein the objective lens array is configured to maintain a focus of the charged-particle sub-beams on the sample in the first and second operation states.

4. The charged particle-optical device of claim 1, wherein the objective lens array comprises a first electrode configured to have a first electrode potential and a second electrode configured to have a second electrode potential, the first electrode being up-beam of the second electrode.

5. The charged particle-optical device of claim 4, wherein in the first operation state, the first electrode potential is more positive than the second electrode potential.

6. The charged particle-optical device of claim 4, wherein in the second operation state, the second electrode potential is more positive than the first electrode potential.

7. The charged particle-optical device of claim 4, wherein at least the first electrode potential is adjusted between the first and second operation states to maintain a focus of a primary sub-beam on the sample in the first and second operation states.

8. The charged particle-optical device of claim 4, wherein adjacent electrodes are separated by an insulating structure which is configured for use in the first operation state and the second operation state, preferably wherein the objective lens array comprises the insulating structure.

9. The charged particle-optical device of claim 8, wherein the insulating structure is formed of a main body and a protrusion radially inwards of the main body, the main body featuring a first and second side, the first side opposing the second side, wherein: on the first side of the insulating structure the main body contacts one of the electrodes and a first gap is formed between the protrusion and the one of the electrodes, and on the second side of the insulating structure, the main body contacts another one of the electrodes and a second gap is formed between the protrusion and the other of the electrodes.

10. The charged particle-optical device of claim 4, further comprising an electric power source which is configured to apply the first electrode potential to the first electrode and/or the second electrode potential to the second electrode.

11. The charged particle-optical device of claim 1, wherein the detector array is configured to be proximate the sample.

12. The charged particle-optical device of claim 1, wherein the charged particle-optical device is configured to maintain a distance between the detector array and the sample between the first and second operation states and vice versa.

13. The charged particle-optical device of claim 1, wherein the charged particle-optical device is configured to alter a distance between the detector array and the sample so that the secondary charged particles are focused on the detector array when in the first operation state and the backscattered charged particles are focused on the detector array when in the second operation state.

14. The charged particle-optical device of claim 1, wherein the charged particle-optical device is configured in use to alter a distance between the objective lens array and the sample when switching between the first and second operation states and vice versa.

15. The charged particle-optical device of claim 1, wherein the charged particle-optical device is configured to switch the device between the first and second operation state continuously.

16. A charged particle-optical device configured to project an array of beams of charged particles towards a sample, the charged particle-optical device comprising:

an objective lens array configured to project the array of beams onto the sample; and an array of detectors configured to detect backscattered particles from the sample, wherein the charged particle-optical device is configured to switch between two operation states, wherein in a first operation state, the detector array is configured to detect more secondary charged particles than backscattered charged particles, and in a second operation state, the detector array is configured to detect more backscattered charged particles than secondary charged particles.

17. The charged particle-optical device of claim 16, the objective lens array comprising an array of objective lenses configured to project a respective sub-beam onto the sample, wherein in the first operation state, the objective lenses are configured to decelerate the beam onto the sample, and in the second operation state, the objective lenses are configured to accelerate the beam onto the sample.

18. The charged particle-optical device of claim 16, wherein the objective lens array is configured to maintain a focus of the array of beams on the sample in the first and second operation states.

19. A method of selectively detecting secondary charged particles and backscatter charged particles emitted from a sample, the method comprising:

a) selecting a mode of operation of a detector between:

a backscatter mode for detecting more backscatter charged particles than secondary charged particles; and a secondary mode for detecting more secondary charged particles than backscatter charged particles;

b) projecting a plurality of charged particle beams onto a surface of the sample; and c) detecting charged particles emitted from the sample in the selected mode of operation.

20. The method of claim 19, further comprising accelerating the plurality of charged particle beams in an objective lens array in the backscatter mode and/or decelerating the plurality of charged particle beams in an objective lens array in the secondary mode.

* * * * *